United States Patent
Nobori et al.

[11] Patent Number: 5,616,024
[45] Date of Patent: Apr. 1, 1997

[54] APPARATUSES FOR HEATING SEMICONDUCTOR WAFERS, CERAMIC HEATERS AND A PROCESS FOR MANUFACTURING THE SAME, A PROCESS FOR MANUFACTURING CERAMIC ARTICLES

[75] Inventors: Kazuhiro Nobori, Haguri-gun; Ryusuke Ushikoshi, Tajimi; Koichi Umemoto, Toyota; Atsushi Sakon, Nagoya; Yusuke Niiori, Inuyama; Masahiro Murasato, Chita, all of Japan

[73] Assignee: NGK Insulators, Ltd., Japan

[21] Appl. No.: 380,190

[22] Filed: Jan. 27, 1995

[30] Foreign Application Priority Data

Feb. 4, 1994 [JP] Japan .................................. 6-012667

[51] Int. Cl.$^6$ ........................................................ F27D 3/12
[52] U.S. Cl. .............................. 432/241; 432/5; 432/14; 432/120; 432/239
[58] Field of Search ........................... 432/5, 9, 14, 120, 432/121, 239, 241, 247

[56] References Cited

FOREIGN PATENT DOCUMENTS 54-87951   7/1979   Japan .
498784     3/1992   Japan .

*Primary Examiner*—Henry A. Bennett
*Assistant Examiner*—Siddharth Ohri
*Attorney, Agent, or Firm*—Parkhurst, Wendel & Burr, L.L.P.

[57] ABSTRACT

A ceramic heater composed of a ceramic substrate and a resistant heating element embedded within the ceramic substrate along a predetermined planar pattern is obtained by holding a convolution of a spiral-coiled high melting metallic filament in the above predetermined planar pattern and heat-treating the convolution at a temperature not higher than a primary recrystallization commencement temperature of the high melting metal under a non-oxidative atmosphere to provide the resistant heating element, embedding the resulting resistant heating element within a ceramic shaped body, and then, sintering the ceramic shaped body. In a preferred embodiment, the resistant heating element is a convolution of a spiral coil, the number of coils per a unit length of said convolution is set at a predetermined value in each of defined domains of the ceramic heater, and when the number of coils per a unit length of the convolution is determined, the relation of the maximal value, the minimal value and the mean value, of all the determined numbers of coils in the above domains, satisfies the formula:

(maximal value−minimal value)/mean value $\leq 0.1$.

Another preferred embodiment comprising a disc-shaped ceramic substrate and a resistant heating element embedded within the substrate is adapted for application in semiconductor wafer heating, wherein a resistant heating element having a planar shape composed of a plurality of concentric loops differing in diameters from each other and connecting portions which connect inner loops in sequence with outer loops to form a series of resistant heating element. In a process for manufacturing ceramic articles composed of a ceramic substrate, an electroconducting body embedded within the ceramic substrate and a conduit or pit bored avoiding the above electroconducting body in the ceramic substrate, an X-ray transmission photograph of the ceramic substrate is taken and then the conduit or pit is formed based on the X-ray transmission photograph.

20 Claims, 28 Drawing Sheets

FIG_3a
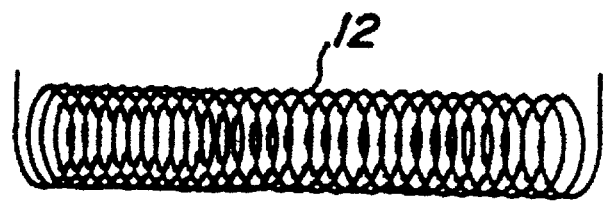
FIG_3b
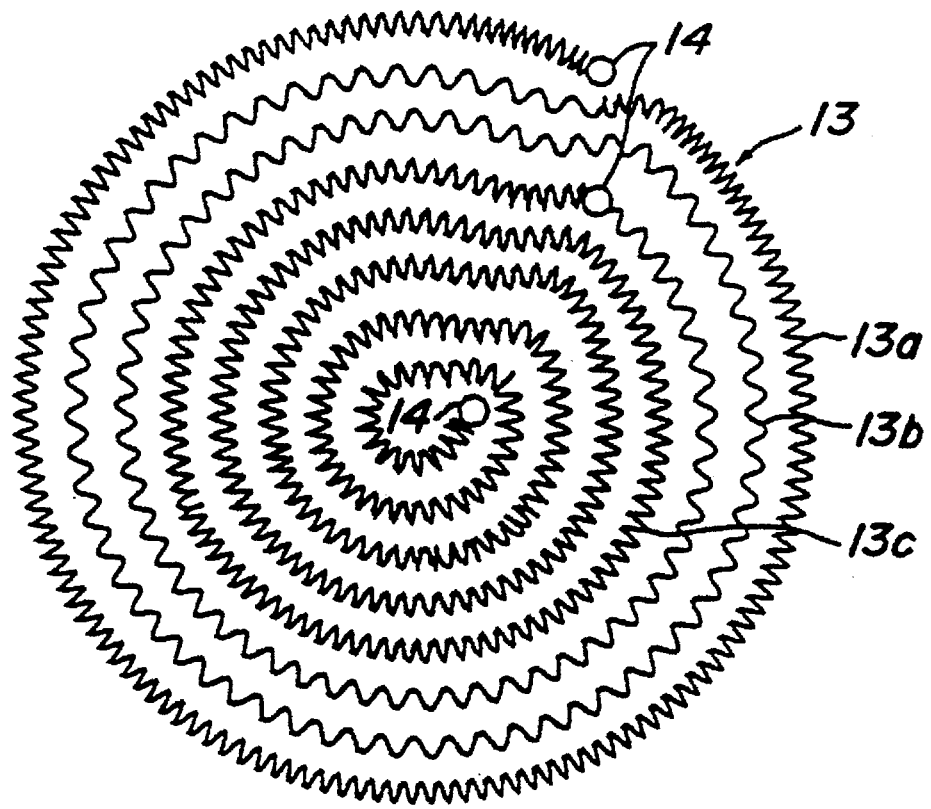

FIG._5a
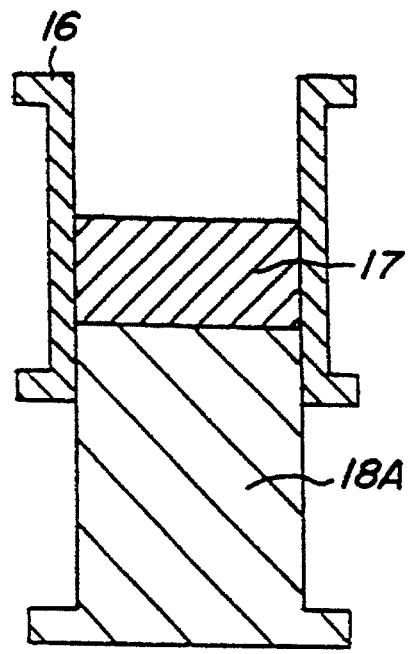
FIG._5b
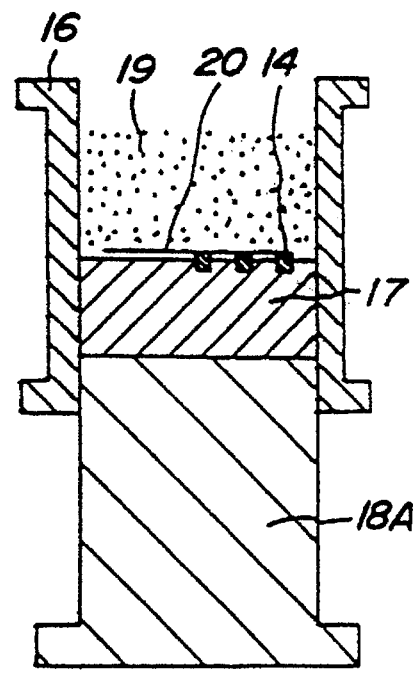
FIG._5c
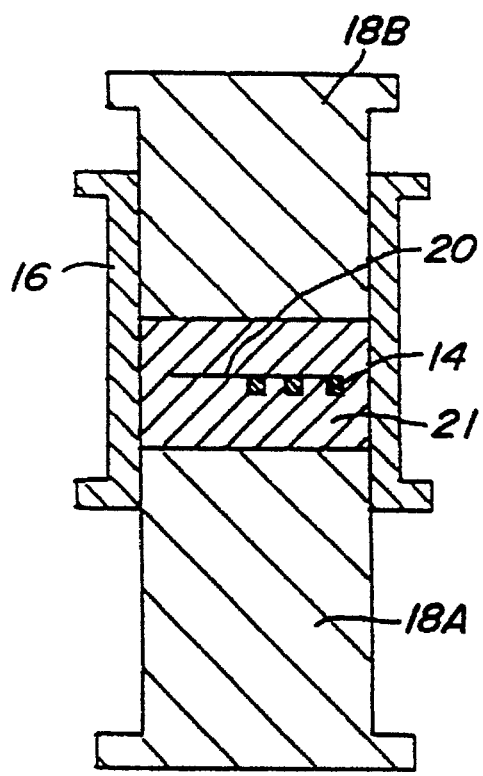
FIG._5d
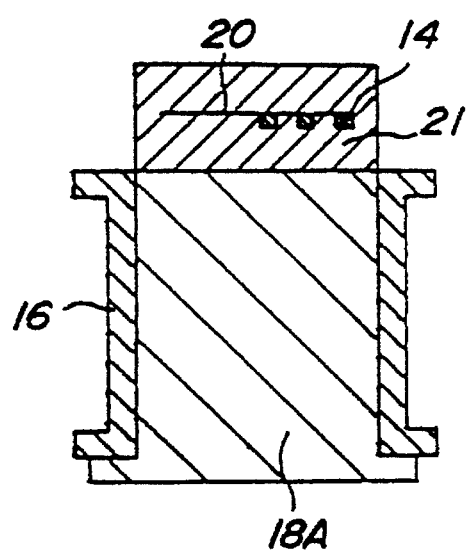

FIG_7
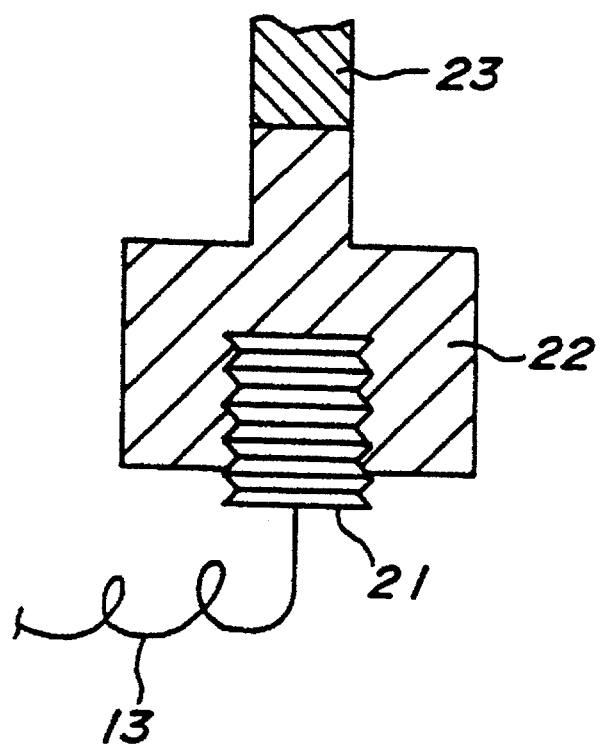

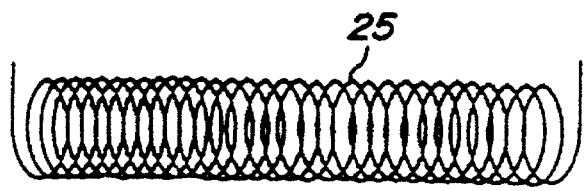
FIG_8
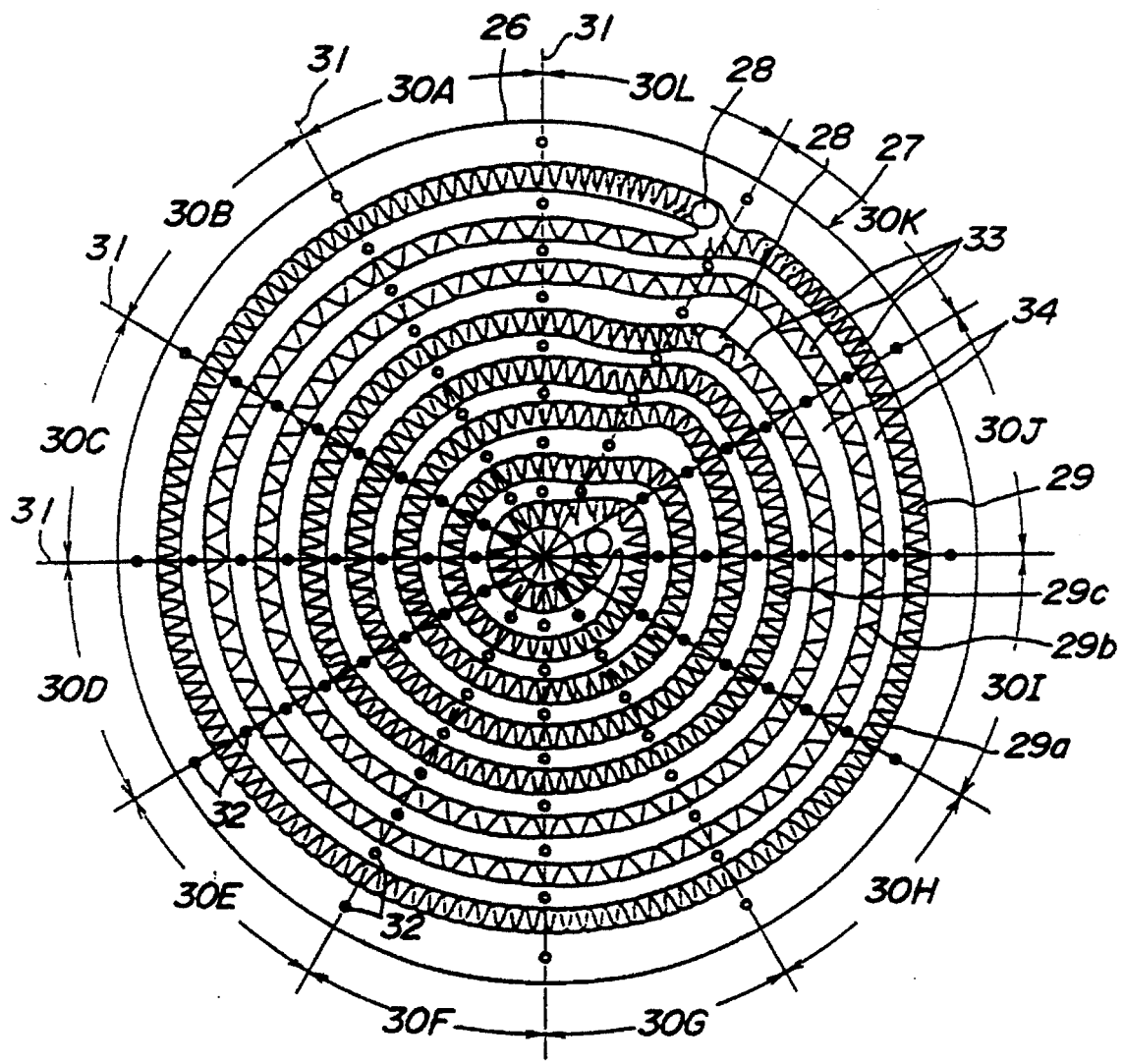
FIG_9

FIG_10a
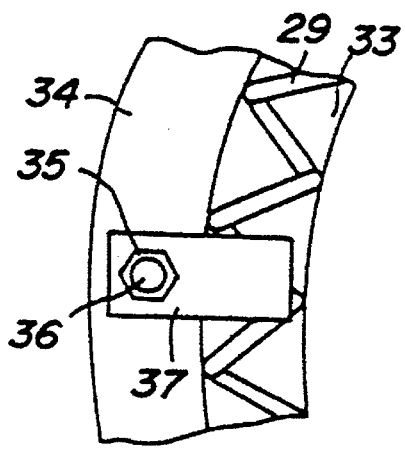
FIG_10b
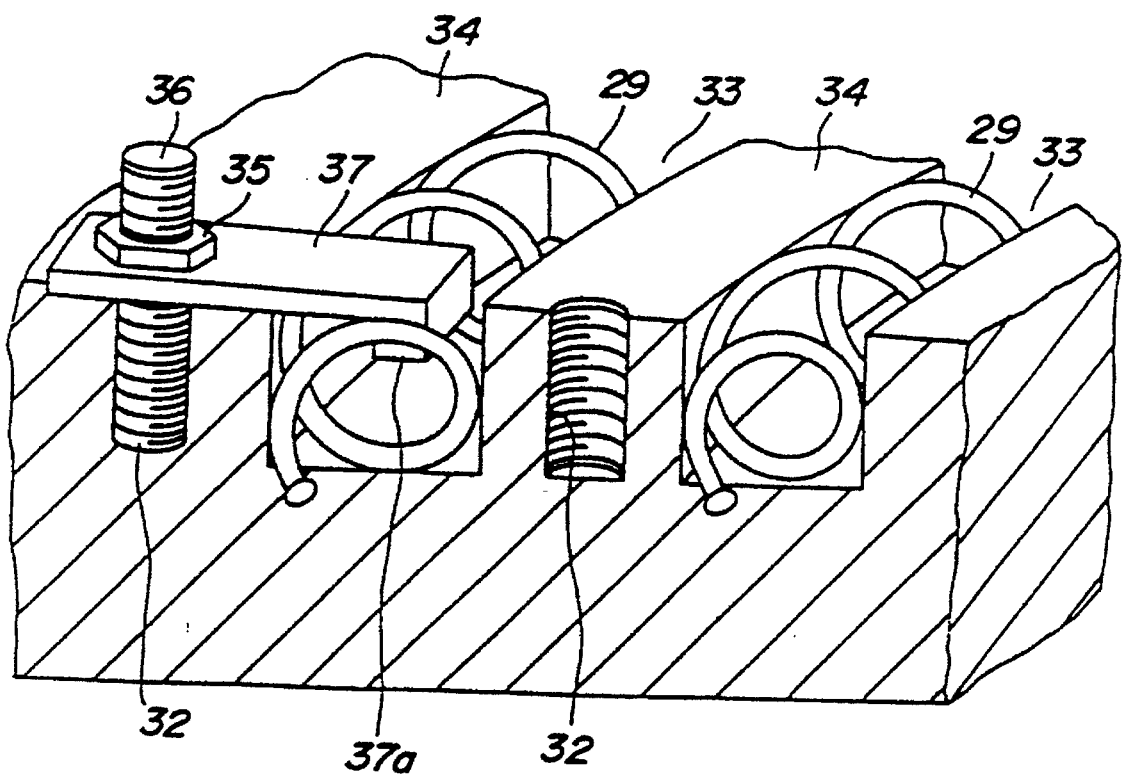

FIG_11a
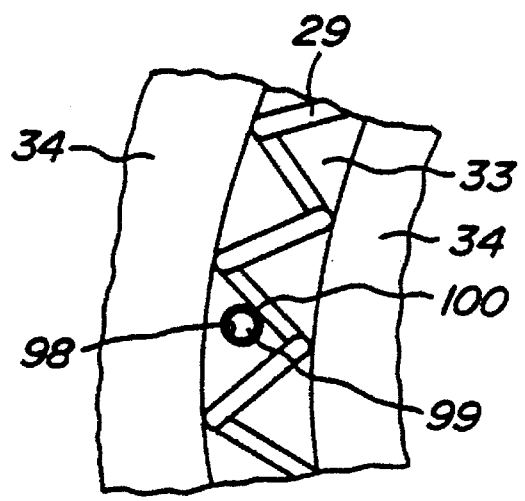
FIG_11b
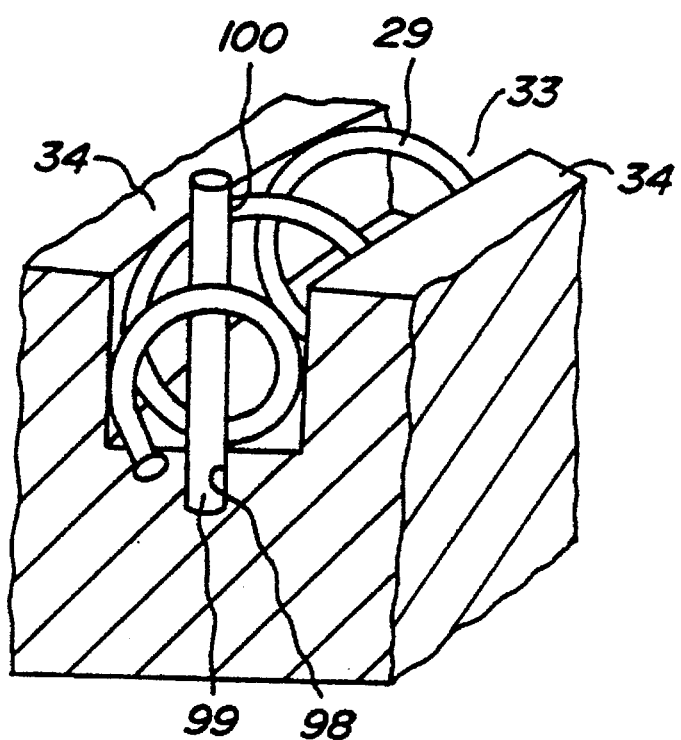

FIG_17

FIG_19

FIG_21
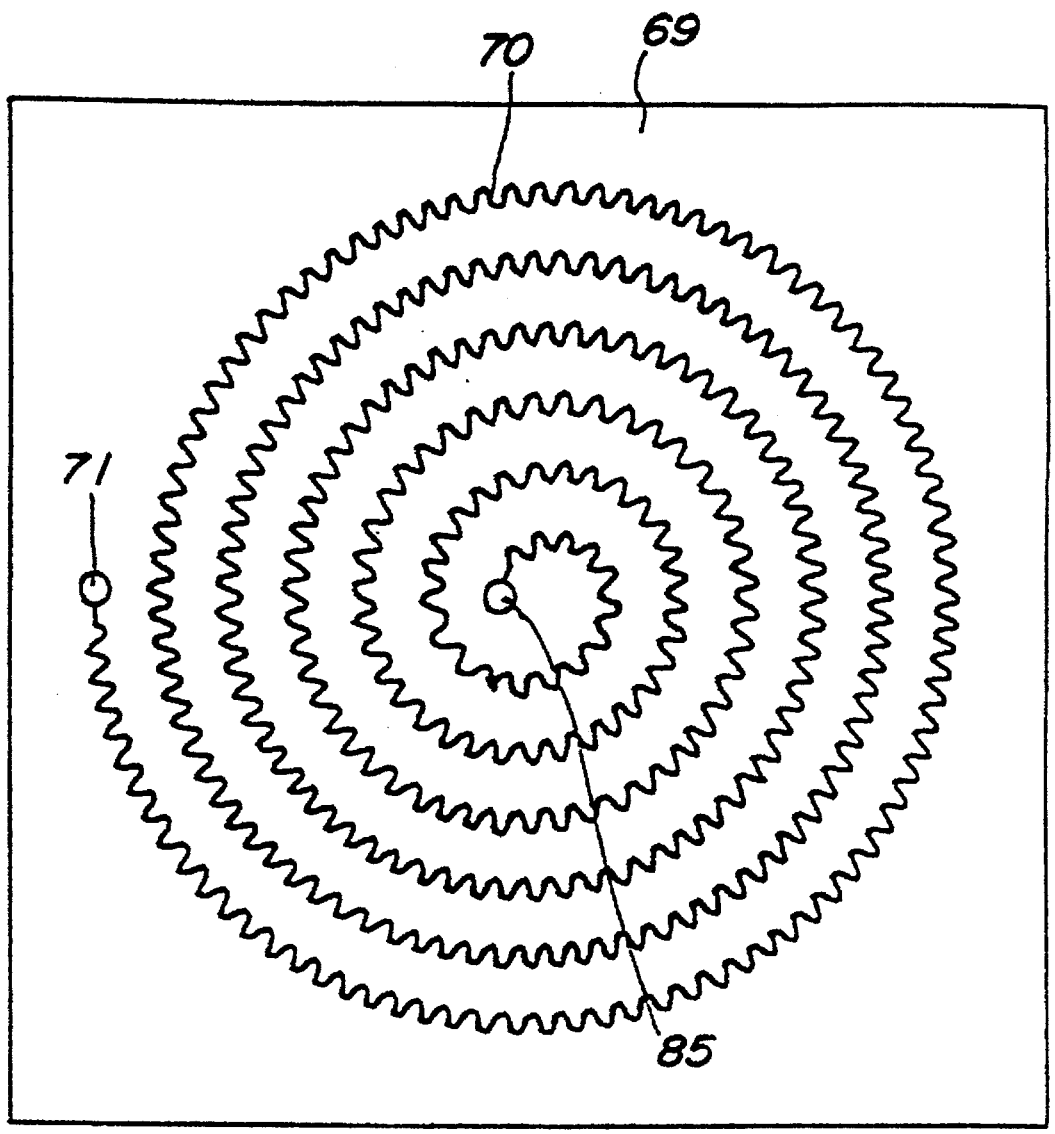

FIG_24a
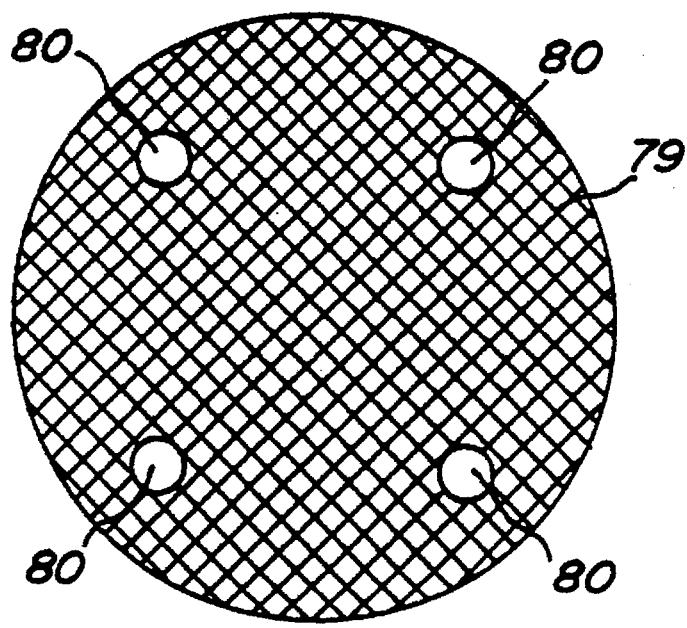
FIG_24b
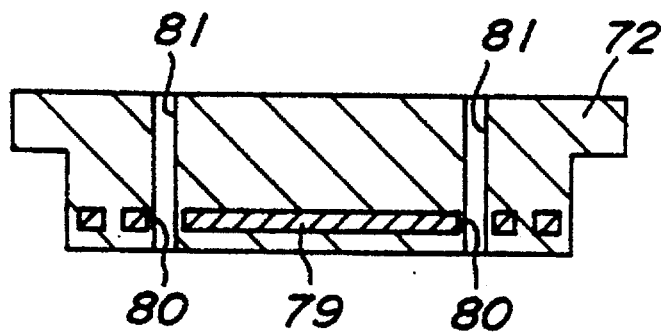

APPARATUSES FOR HEATING SEMICONDUCTOR WAFERS, CERAMIC HEATERS AND A PROCESS FOR MANUFACTURING THE SAME, A PROCESS FOR MANUFACTURING CERAMIC ARTICLES

BACKGROUND OF THE INVENTION

1. Field of the Invention

The present invention relates to ceramic articles, such as ceramic heaters or the like, which are preferably adapted for application in diversified apparatuses for manufacturing semiconductors and etching apparatuses, such as for plasma CVD, low pressure CVD, plasma etching, photoetching, or the like, and manufacturing processes thereof.

2. Description of the Related Art

As a heat source in apparatuses for manufacturing semiconductors, so-called "stainless heaters" have been generally used. However, these heat sources have posed a problem such that particles generate by the action of halogenous corrosive gases. Therefore, indirect heating type wafer heating apparatuses have been developed, which comprise a container to be exposed to deposition gases or the like, equipped with an infrared lamp on the outside and provided with an infrared-transparent window on an exterior wall thereof. With the heating apparatuses of this type, infrared energy is irradiated towards a heating target composed of an excellent corrosion-resistant material, such as graphite or the like, to heat a wafer placed on the upper surface of the heating target.

However, the heaters of this type have the disadvantages of increased heat losses and lengthy temperature rise times, as compared with direct heating heaters, and insufficient efficiency in heating of the target, which is induced by gradual increases in hampering of infrared transmission and in heat absorption of the infrared-transparent window, with increasing deposition of CVD membrane thereon.

In order to solve these problems, the present inventors proposed a ceramic heater comprising a high melting metallic wire embedded within a dense ceramic disc-shaped substrate, as an integral structure. This wire is in a spiral-coiled shape within the disc-shaped substrate and connected at both ends thereof with terminals. It has been found that this ceramic heater has excellent characteristics, particularly, adapted for application in the manufacture of semiconductors.

However, it also has been found that such a disc-shaped ceramic heater presents some problems, particularly, from a manufacturing point of view.

Namely, in order to manufacture a ceramic heater as described above, a high melting metallic wire or filament is wound up into a convolution, both ends of which are connected with terminals (electrodes), respectively. A ceramic powder is charged into a press-molding machine and preformed to have a certain degree of hardness. In this case, a continuous recess or groove is provided along a predetermined planar pattern on the surface of the preform. Then, the convolution is laid in the recess and further covered with the ceramic powder. Then, the ceramic powder is subjected to a uniaxial pressure molding to provide a disc-shaped molded body which is then sintered by hot-pressing.

However, when the above convolution is laid along the predetermined planar pattern on the preform, the convolution must be manually inserted into and along the recess of the preform, which is tedious and troublesome work. Moreover, during this work, positional deviation or deformation of the convolution inevitably takes place. As a consequence, the position of the resistant heating element is not fixed as designed within the sintered ceramic substrate, thereby forming thick and thin portions in heat radiation value. As a result, the temperature of the heating surface becomes uneven and heating characteristics of the heater are not stable. The uneven temperature on the heating surface of the heater, particularly, in the case of semiconductor manufacturing apparatuses, will result in an uneven thickness of semiconductor membranes which causes defective semiconductors.

Particularly, in the case where a disc-shaped ceramic heater is practically manufactured, it has been found that elimination of the unevenness of the heating surface to achieve uniform temperatures is unexpectedly difficult. For example, a heating device for semiconductor manufacturing apparatuses are required to achieve an extremely high performance of uniform heating at a setting temperature as high as 700° C., 800° C. or even higher over the heating surface, to thereby restrict differences of the minimal temperature and maximal temperature from the averaged temperature within about 1%, respectively, on the heating surface.

However, it has been difficult to realize such a high performance of uniform heating in ceramic heaters having a structure as described above. Because, the convoluted resistant heating elements are usually formed from a spiral coil of a thin resistance wire, which are three-dimensionally deformable rather easily. Therefore, when the convolution is laid within a ceramic shaped body, the position of the convolution may deviate and, further, during firing the shaped body, the ceramic powder may flow, thereby moving the convolution aside resulting in deformation. However, in practical manufacturing processes, these various causes have scarcely been elucidated, so that ceramic heaters with a high performance of uniform heating as described above have been difficult to manufacture consistently.

Furthermore, a new problem has arisen in temperature control of such disc-shaped ceramic heaters. Namely, when a resistant heating element is embedded in a ceramic substrate of ceramic heaters, a convolution of resistant heating element with a constant distance between adjacent loops of the convolution has been used to provide a uniform surface heating to the ceramic heaters for heating wafers.

However, such a convoluted resistant heating element with a constant distance between adjacent loops thereof forms inevitably a marginal portion absent from resistant heating element in the periphery of the heater, whereby a ratio of the surface area of the substrate, that is, the surface area that the heat escapes from, to the heat radiation value of the embedded resistant heating element is increased. Therefore, this portion results in a cool spot on the semiconductor wafer heating surface, resulting in non-uniform heating of the semiconductor wafers.

FIG. 1 is a plan view showing an embodiment of such a ceramic heater, wherein a part of the substrate is omitted, for convenience' sake, particularly in order to display a planar layout pattern of an embedded resistant heating element. In FIG. 1, a disc-shaped heating apparatus 1 has a structure comprising a dense, gastight inorganic substrate 2 composed of silicon nitride or the like and a resistant heating element 3 of a tungsten-based metal or the like embedded in a planar convolute form within the substrate. To the resistant heating element 3, electric power from an outside source can be supplied via a lead wire (not shown), a terminal 4 at the central end and another terminal 5 at the peripheral end. Thus, the disc-shaped heating apparatus 1 can radiate heat.

However, in such a structure comprising a convolution with a constant distance between adjacent loops thereof, a cool spot is necessarily formed in the peripheral zone "C" shown in FIG. 1.

Additionally, relating to the planar pattern or layout of the embedded resistant heating element, the following problem has also been presented. Namely, ceramic heaters to be used for semiconductor wafer heating apparatuses, as shown in the embodiment thereof shown in FIG. 2, that is, a schematic cross-sectional view, have a structure comprising a dense, gastight inorganic substrate 6 composed of silicon nitride or the like and a resistant heating element 8 of a metallic material, such as tungsten, molybdenum or the like, embedded in a planar convolute form within the substrate. The central and peripheral ends of the resistant heating element 8 are connected with terminals 9, 10 for power supply, respectively, and, if required, a pit 11 for setting a thermocouple for temperature measurement and/or a conduit 7 for flowing gas therethrough from the back of the heater are provided at predetermined positions.

The ceramic heaters having the above-described structure have been manufactured according to a process as explained below. A high melting metallic wire or filament is wound up into a convolution and terminals (electrodes) are bonded to both the ends of the filament, respectively. A ceramic powder is charged into a press-molding machine and preformed to provide a certain degree of hardness. A continuous recess or groove is then formed along a predetermined planar pattern on the surface of the preform. Then, the convolution is laid in the recess or groove and further covered with the ceramic powder. Then, the ceramic powder is subjected to a uniaxial pressure molding to provide a disc-shaped molded body which is then sintered by hot-pressing. Then, a pit 11 for setting a thermocouple for temperature measurement and/or a conduit 7 for flowing gas therethrough from the back of the heater are bored, for example, by a mechanical means, at a predetermined spot of the obtained fired body or substrate 6, avoiding the embedded resistant heating element.

However, according to the above-described process for manufacturing ceramic heaters, when the pit 11 and/or conduit 7 are provided by machining, the location of the resistant heating element 8 arranged at the time of shaping had been marked in advance, and then the machining was conducted so as to avoid the above marked location. However, since the resistant heating element 8 deviates from the location marked at the time of shaping, by virtue of firing-contraction occurring during the firing and deformation of the heating element occurring during the pressure molding, the resistant heating element 8 is frequently broken during the machining, due to the above-described deviation, even when the pits or conduits are bored at boring spots predetermined so as to avoid the positions of the resistant heating element 8 indicated by the above described marks. Accordingly, the above method yields many defective products since the convolutions are readily three-dimensionally deformable as described above, whereby shifting of embedding positions occurs frequently.

Furthermore, the above-described ceramic heaters are required to have an improved performance of uniform heating over its wafer heating surface. When the resistant heating element 8 is a convoluted wire, it is necessary to decrease the distance between adjacent loops of the embedded, convoluted resistant heating element 8 to thereby prevent formation of a cool spot at the peripheral portion, in order to achieve a uniform temperature over the wafer heating surface. In this instance, the adjacent loops of the resistant heating element 8 may inadvertently contact each other causing short-circuits, thereby yielding many defective products which do not adequately perform. In addition, when the resistant heating element 8 has a round-coiled form, it is necessary to increase the thickness of the ceramic substrate 6 which is used for heating wafers. However, this poses a problem of increasing heat capacity, resulting in a dull response by disturbance in temperature control and making production of compact heaters impossible.

SUMMARY OF THE INVENTION

The objects of the present invention are, to embed the above-described resistant heating element in ceramic shaped bodies, to allow the embedding operation to be conducted readily and quickly, and to prevent the deviation of the resistant heating element from embedding positions.

Further objects of the present invention are to provide ceramic heaters having a high performance uniform heating over the heating surface thereof, comprising a ceramic substrate and a convoluted resistant heating element embedded therein, which are mass-producible in a constant, high yield.

Alternatively, the object of the present invention is to provide a process for manufacturing ceramic heaters without breaking a resistant heating element embedded within a substrate, at the stage of forming a pit, conduit or the like in the substrate, after firing of the substrate of the ceramic heaters.

Another object of the present invention is to provide compact-sized, ceramic heaters having improved uniform heating performance and excellent temperature control response performance.

The first embodiment of the present invention relates to a process for manufacturing ceramic heaters comprising a ceramic substrate and a resistant heating element embedded within the ceramic substrate along a predetermined planar pattern, which process comprises the steps of: holding a convolution formed by winding a high melting metallic filament in the above predetermined planar pattern; then heat-treating the convolution at a temperature not higher than a primary recrystallization commencement temperature of the above high melting point metal under a non-oxidative atmosphere to provide the resistant heating element; and embedding the resulting resistant heating element within a ceramic shaped body, followed by firing.

The heat treatment is preferably conducted at temperatures not lower than 800° C.

The high melting point metal may comprise preferably tungsten, which can be heat-treated at 800°–900° C.

The above heat treatment is preferable to be conducted under a non-oxidative atmosphere.

When this process is conducted, it is preferred to use a mold for heat-treating the convolution formed by winding a high melting point metallic filament, which mold comprises a material stable at heat treatment temperatures of the high melting metal and has a groove or recess of a predetermined planar pattern for holding the convolution.

In the case where such a mold is used, it is preferred to provide the mold with members for securing the convolution at its predetermined spots on the mold to keep the planar pattern of the untreated convolution.

Alternatively, the present invention relates to a ceramic heater comprising a ceramic substrate and a resistant heating element embedded within the ceramic substrate along a predetermined planar pattern, which resistant heating element has been obtained by holding a convolution formed by winding a high melting point metallic filament along the above predetermined planar pattern, then heat-treating the convolution at a temperature not higher than a primary recrystallization commencement temperature of the above-mentioned high melting point metal under a non-oxidative atmosphere.

Thus, since the untreated convolution is confined in the groove or recess of the mold and then heat-treated, the resistant heating element is provided with shape-stability in the planar pattern. Accordingly, the resistant heating element can be readily removed from the mold and laid onto the preform in a short time. Since convolutions as described above are readily deformable three-dimensionally, laying of a convolution on a preform, while keeping its planar pattern, has been known to be very difficult. However, the present invention has decreased the deviation of the embedding position, during or even after laying, of the resistant heating element, so that the resulting ceramic heaters have improved uniform heating performance over the heating surface thereof.

Furthermore, deterioration or denaturing of the untreated convolutions themselves can be reduced by heat-treating the untreated convolutions under a non-oxidative atmosphere. Furthermore, the untreated convolutions are heat-treated at a temperature not higher than the primary recrystallization commencement temperature of the high melting point metal which constitutes the convolutions. Heat treatment temperatures in excess of the primary recrystallization commencement temperature will make the resistant heating element brittle.

The higher the strength of the heat-treated resistant heating element, the better. Therefore, it is necessary to minimize the deterioration or denaturing caused by heat treatment. From this point of view, the above heat treatment is preferably conducted at a temperature not higher than the primary recrystallization commencement temperature of the high melting point metal. Further, the above heat treatment is preferably conducted at a temperature not lower than 800° C. in order to provide the resistant heating element with shape-stability.

In the case where the high melting metal is tungsten, the above heat treatment conducted at 800°–900° C. will provide a sufficient shape-stability and not deteriorate the resistant heating element.

In the present invention, it is preferable to heat-treat the convolutions under a non-oxidative atmosphere. Such a non-oxidative atmosphere includes vacua of not exceeding $10^{-3}$ torr., a hydrogen atmosphere, and an inert gas atmosphere, such as nitrogen, argon or the like.

Alternatively, the second embodiment of the present invention relates to a ceramic heater comprising a ceramic substrate and a resistant heating element embedded within the substrate, wherein the resistant heating element is a convolution of a spiral coil, the number of coils per a unit length of the convolution is set at a predetermined value in each of defined domains of the ceramic heater, and when the number of coils per a unit length of the convolution is determined, the relation of the maximal value, the minimal value and the mean value, of all the determined numbers of coils in the above domains, satisfies the formula:

(maximal value–minimal value)/mean value≦0.1.

A preferred manufacturing process for manufacturing such a ceramic heater comprising the steps of:

holding an untreated convolution in a predetermined planar pattern in a fashion such that, when the number of coils per a unit length of the untreated convolution is determined, the relation of the maximal value, the minimal value and the mean value, of all the determined numbers of coils in the above domains, satisfies the formula:

(maximal value–minimal value)/mean value≦0.05;

then heat-treating the above untreated convolution, under a non-oxidative atmosphere to provide a convolution;

then embedding the resulting convolution within a ceramic shaped body; and then sintering the above ceramic shaped body to provide a ceramic heater.

Additionally, in this embodiment, the untreated convolution is held in a predetermined planar pattern, preferably by securing the untreated convolution at its predetermined portions on the mold.

The inventors have conducted studies to realize constant, high yield, mass-production of ceramic heaters with an extremely high performance of uniform heating such that on the heating surface thereof, both the difference between the minimal temperature and the averaged temperature and the difference between the maximal temperature and the averaged temperature are restricted to within about 1%, respectively. In the course of these studies, techniques for determining the number of coils of convolutions, or embedding patterns, have been developed based on X-ray photographs of fired ceramic heaters, which have been further studied from various aspects.

In the above course of study, the inventors determined the number of coils per a unit length of the convolution and conducted research to understand the relationship among the maximal value and minimal value with the mean value, of all the determined numbers of coils in the above domains. As a result, it has been found that when the value of "(maximal value–minimal value)/mean value" is 0.1 or less, the performance of uniform heating over the heating surface is suddenly improved. Moreover, it has been found that, if the embedding state meets a condition to satisfy the value of "(maximal value–minimal value)/mean value" being 0.1 or less, an extremely high performance of uniform heating as described above can be realized.

Thus, by controlling convolutions after firing to be in the state satisfying the above conditions, ceramic heaters with a high performance of uniform heating have become mass-producible consistently and with high yield. Therefore, the present invention is industrially very useful.

Furthermore, the present inventors have further proceeded with research, in order to readily mass-produce ceramic heaters having such an embedding state. The problem to be solved then is a difficulty in realizing an embedding state as described above, particularly because when a convolution is embedded within a ceramic shaped body, the convolution that is very easily and freely three-dimensionally deformable has been manually transported and embedded, so that the position of the convolution is likely to deviate and the number of coils is irregularized.

The present inventors, as a result of the study of this problem, have found that the irregularity of the number of coils of convolutions is remarkably decreased by holding an untreated convolution composed of resistance wire or the like in a predetermined planar pattern in a fashion such that, when the number of coils per a unit length of the untreated convolution is determined, the relation of the maximal value, the minimal value and the mean value, of all the determined numbers of coils in the above-described domains, may satisfy the formula:

(maximal value−minimal value)/mean value ≦ 0.05;

then heat-treating the above untreated convolution under a non-oxidative atmosphere.

The shape of the untreated convolution can be set very easily by holding the untreated convolution in a predetermined planar pattern, by securing the untreated convolution at its predetermined spots on the mold by means of fixing members, which also can facilitate the securing work.

Thus, the present invention can provide ceramic heaters with an extremely high performance of uniform heating such that, on the heating surface thereof, both the difference between the minimal temperature and the averaged temperature and the difference between the maximal temperature and the averaged temperature are restricted to within about 1%, respectively. Moreover, such ceramic heaters are mass-producible consistently with high yield.

Alternatively, the third embodiment of the present invention relates to semiconductor wafer heating apparatuses comprising a disc-shaped ceramic substrate and a resistant heating element embedded within the above ceramic substrate, wherein the planar shape of the resistant heating element comprises a plurality of concentric loops differing in diameter from each other and connecting portions which connect inner loops in sequence with outer loops to form a series of resistant heating element.

In this embodiment, the resistant heating element is preferably divided into a peripheral portion and an inside portion of the substrate, which can control the heat radiation value of each of the resistant heating elements in the peripheral portion and inside portion, independently.

The substrate can be provided on its peripheral side surface with terminals for supplying power to the resistant heating element.

Furthermore, the loops can be partly bent inwardly with a large curvature. In the area half-surrounded by the bend, the aforementioned conduit or pit can be bored.

According to such a construction of this embodiment, since it is possible to make the surface area of the substrate, that is, the area from which heat escapes, constant against the heat radiation value of the embedded resistant heating element, by forming the outermost circumferential resistant heating element into a concentric loop, so that cool spots of the heating surface can be eliminated to heat more uniformly the semiconductor wafer heating surface.

Namely, according to the present invention, since its planar shape comprises a plurality of concentric loops differing in diameter from each other and connecting portions connecting inner loops in sequence with outer loops to form a series of resistant heating element, the semiconductor wafer heating apparatuses of the invention can minimize the breadth of the temperature distribution on the wafer heating surface, during heating, while maintaining an advantageous decrease in heat losses in semiconductor wafer heating apparatuses comprising a dense ceramic and a resistant heating element embedded therein. Therefore, the apparatuses of the present invention can realize more uniform heating when semiconductor wafers are heated.

Alternatively, the fourth embodiment of the present invention in manufacturing ceramic articles comprising a ceramic substrate and an electroconducting body embedded therein, is a process for boring a conduit or pit in the ceramic substrate, avoiding the electroconducting body, wherein an X-ray transmission photograph of the ceramic substrate is taken and the above conduit or pit is formed based on the X-ray transmission photograph.

In this embodiment, a resistant heating element comprising the electroconducting body, and terminals for supplying power to the resistant heating element are embedded within the ceramic substrate and then the surface provided with the terminals can be set to face an X-ray film when the X-ray transmission photograph is taken.

Additionally, the boring position of the above pit or conduit can be determined by taking an X-ray transmission photograph, compensating the deviation from the object shown in the X-ray transmission photograph by utilizing a metal piece as a marker which has been fixed on the ceramic substrate.

According to the above-described construction of this embodiment, when a conduit or pit is formed in ceramic substrate, since the layout of the embedded electroconducting body is located in advance based on an X-ray transmission photograph of the embedded electroconducting body which has been taken for every ceramic substrate, the actual, exact layout of the electroconducting body after firing can be established, including positional deviation of the electroconducting body caused by deformation occurring during pressure molding or by firing-contraction occurring during firing, of the ceramic substrate. Consequently, pits, conduits and the like can be bored without any breakages of the electroconducting body.

Additionally, in the above construction, it is preferred to set the surface provided with terminals to face an X-ray film, or utilize a metal piece for positioning, when an X-ray transmission photograph is taken, which allows boring positions to be determined accurately.

Alternatively, the fifth embodiment of the present invention relates to a ceramic heater comprising a disc-shaped ceramic substrate for heating wafers and a resistant heating element embedded therein, characterized in that the resistant heating element is a spiral coil embedded in a fashion such that the spiral coil is flattened in the vertical direction of the ceramic substrate and that the ratio of the dimension in the horizontal direction to the dimension in the vertical direction of the spiral coil, is in the range of 1.5–3.0.

In this embodiment, the ceramic substrate can be shaped into a disc.

In the above construction of this embodiment, the cross-section of the spiral coil constituting the convoluted resistant heating element is flattened to have a predetermined aspect ratio and the resistant heating element is embedded so as to orient the major axis of the cross-section of the flattened coil in parallel with the radial direction of the ceramic substrate. Namely, the resistant heating element is embedded in a fashion such that the flat side of the spiral coil is in parallel with the radial direction of the ceramic substrate and that the ratio of the dimension in the radial direction to the dimension in the thickness direction of the spiral coil, is in the range of 1.5–3.0.

Thus, the portion where the resistant heating element is absent can be decreased, the performance of uniform heating over the wafer heating surface can be improved and the thickness of the ceramic substrate can be decreased, with the consequence that compaction of ceramic heaters can be achieved and, moreover, response performance in temperature control can be improved.

In the present invention, the phrase, "the ratio of the dimension in the radial direction to the dimension in the thickness direction of the spiral coil, is in the range of 1.5–3.0" does not mean a flat cross-sectional shape of the material filament of the resistant heating element, but rather the transverse section of the resistant heating element spiral coil being flat with an aspect ratio of 1.5/1–3/1. In this invention, the term "aspect ratio" should be understood to mean a ratio of major axis to minor axis of a transverse section of a flattened spiral coil. In this invention, this aspect ratio is limited in the range of 1.5–3.0, because, as apparent from the working examples described hereinafter, an aspect ratio less than 1.5 makes the flat shape almost meaningless and deteriorates the response performance, and an aspect ratio in excess of 3.0 will shorten the life of the heating element due to breakages. Additionally, the term "flat side" refers to the side in parallel with the major axis of the transverse section of the flattened spiral coil.

BRIEF DESCRIPTION OF THE DRAWINGS

FIG. 3a is a front elevational view showing a spiral coil material 12 of convolutions;

FIG. 3b is a plan view schematically showing an untreated convolution 13;

FIG. 5a is a vertical sectional view schematically showing formation of a preform 17;

FIG. 5b is a vertical sectional view schematically showing loading of a ceramic powder onto the preform;

FIG. 5c is a vertical sectional view schematically showing pressure molding of an integrated whole body;

FIG. 5d is a vertical sectional view schematically showing releasing of a shaped body from the mold;

FIG. 7 is a vertical sectional view showing a terminal portion for electric power supply, connected with an untreated convolution 13;

FIG. 8 is a front view showing a spiral coil material 25 of the convolutions;

FIG. 9 is a plan view showing a state of an untreated convolution 29 laid in a groove 33 of a mold 27;

FIG. 10a is a partial plan view showing a secured state of an untreated convolution 29 by means of a fixing member 37;

FIG. 10b is a perspective view, partly broken, showing a secured state of an untreated convolution 29 by means of a fixing member 37;

FIG. 11a is a partial plan view showing a secured state of an untreated convolution 29 by means of another type of fixing member 99;

FIG. 11b is a slant view, partly broken, showing a secured state of an untreated convolution 29 by means of the above fixing member 99;

FIG. 21 is a plan view showing an example of X-ray transmission photographs utilized in the present invention;

FIG. 24a is a plan view showing a mesh electrode;

FIG. 24b is a vertical sectional view schematically showing a state of the electrode of FIG. 24a embedded within a ceramic substrate;

FIG. 29b is a schematic view showing a cross-section cut along the K—K line in FIG. 29a;

FIG. 30b is a schematic view showing a shape of the spirally coiled resistant heating element, viewed from the direction shown by the arrow in FIG. 30a;

DESCRIPTION OF THE PREFERRED EMBODIMENTS

Figure 1:
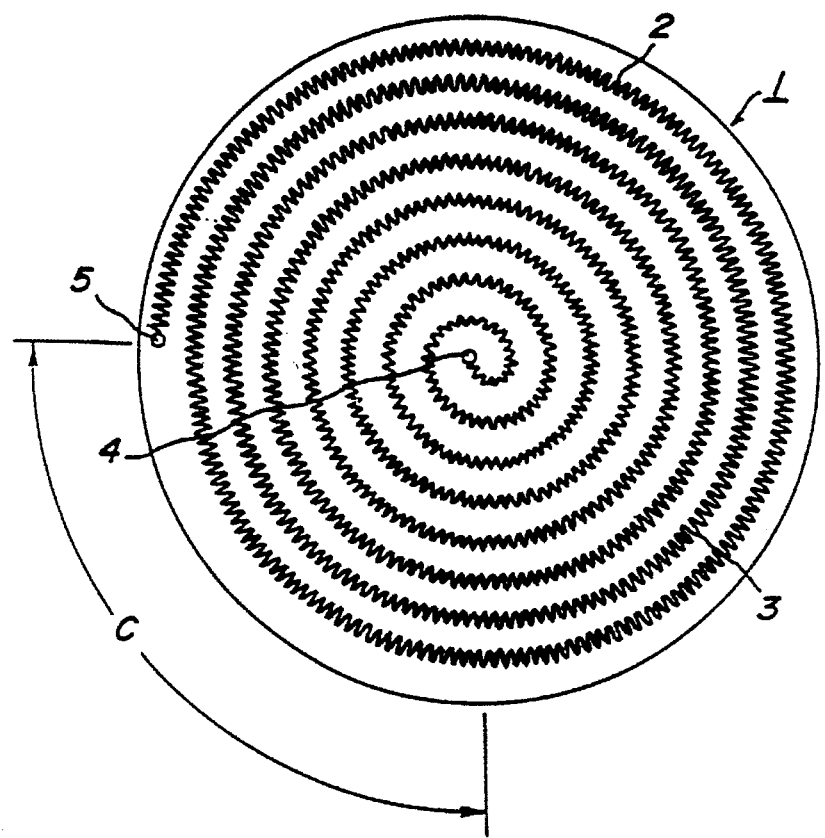
FIG. 1 is a plan view showing an embodiment of conventional semiconductor wafer heating apparatuses, which, for convenience sake shows a planar embedding pattern of a resistant heating element, omitting a part of the substrate.
Figure 2:
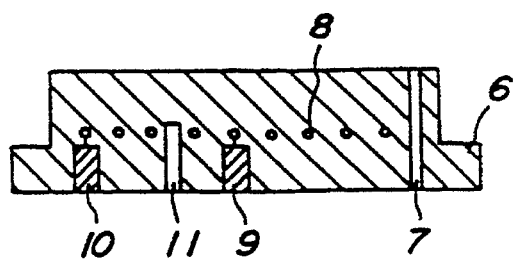
FIG. 2 is a vertical sectional view showing an embodiment of a profile of a conventional ceramic heater.

The present invention will be explained hereinafter by way of example.

In the example of the first embodiment of the present invention, at the outset, a high melting point metallic wire is spirally coiled into a spiral coil 12 as shown in, for example, FIG. 3a. In this example, the spiral coil 12 formed by coiling a wire into a spiral shape was used. The lateral cross-sectional shape of the spiral can be circular, oval, rectangular or the like. Additionally, at the stage shown in FIG. 3a, the spiral coil 12 has a relatively small distance between its successive coils in the longitudinal direction.

Then, the spiral coil 12 is set in a predetermined planar pattern. As the means therefor, any discretional method can be adopted. However, it is preferred to lay the spiral coil in a groove provided along the above pattern on a mold. At this stage, the means are roughly divided into two methods.

According to the first method, with a certain jig, an untreated convolution 13 having a planar pattern as shown in FIG. 3b is produced from the spiral coil. The pattern produced in this example is for a two-zone heating type heater. Namely, one of three columnar terminals 14 is connected with the outermost end of the untreated convolution 13 and another one is connected with the central end of the convolution 13 and the remaining one is connected to a midway portion therebetween. In the convolution 13, the outermost loop 13a has a small distance between successive coils, the loops 13b of the intermediate portion between the outermost loop 13a and the midway terminal 14 have an increased distance between successive coils, and the loops 13c of the inside portion have relatively a small distance between successive coils.

Figure 4A:
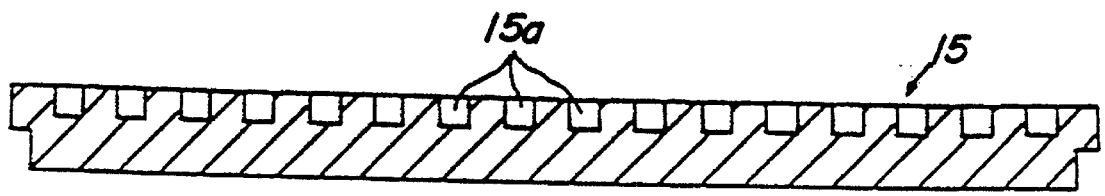
FIG. 4a is a vertical sectional view showing a mold 15.
Figure 4B:
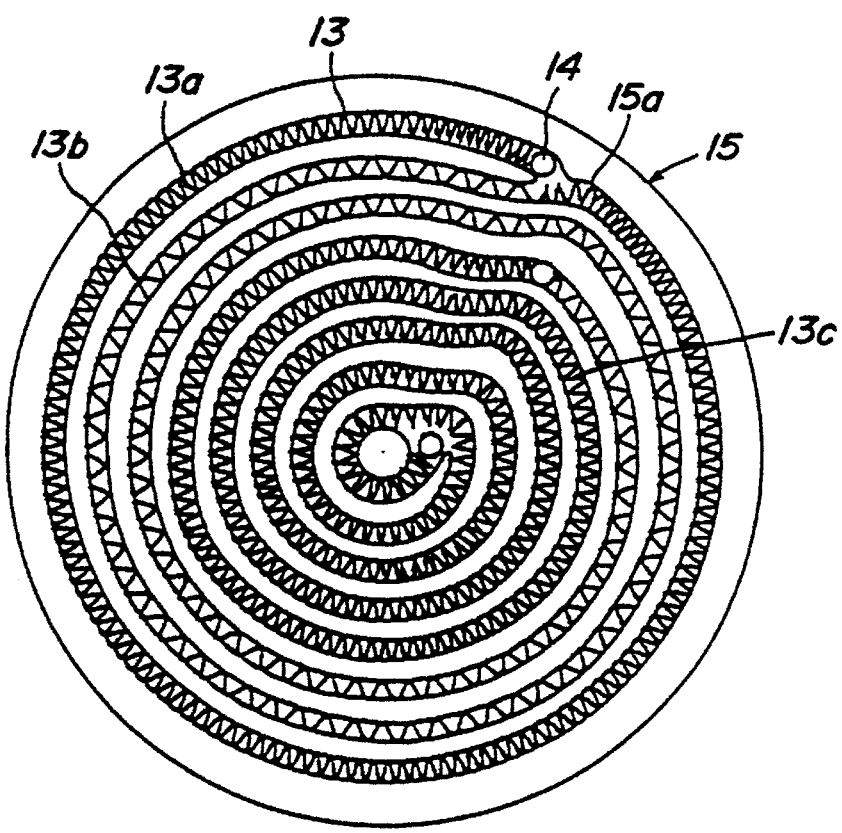
FIG. 4b is a plan view showing a state of an untreated convolution 13 laid in a groove 15a of the mold 15.

A mold 15 as shown in FIGS. 4a and 4b is prepared. On the surface side of the mold 15, a groove 15a having a nearly rectangular cross-section is formed. The groove 15 has the same planar pattern as that of the untreated convolution. Then, the groove 15a receives the untreated convolution 13.

In the second method, the spiral coil 12 of FIG. 3a is extended and then laid sequentially in the groove 15a of the mold 15, thereby to form an untreated convolution 13 in the groove 15a.

According to the second method, the transfer work of the untreated convolution 13 from the aforementiond jig to the mold 15 is saved compared with the first method. On the other hand, however, the mold 15, since it is subjected to a heat treatment as described hereinafter, costs more than the aforementioned jig. According to the first method, the working ratio of the expensive mold 15 is increased as compared with the second method.

Then, the convolution 13 is heat-treated at a temperature not higher than the primary recrystallization commencement temperature of the high melting point metal that constitutes the convolution 13, under a non-oxidative atmosphere, to provide a resistant heating element. This resistant heating element is embedded within a ceramic shaped body which is then sintered. At this stage, the following process was conducted in this example.

FIGS. 5a–5d are vertical sectional view schematically showing a manufacturing procedure of a disc-shaped ceramic shaped body. As shown, a ceramic powder is charged onto a bottom tool 18A (inside a frame 16) and pressure molded to provide a preform 17. Holes for receiving terminals are bored on the preform and a resistant heating element 20 is placed on the preform 17, with the terminals 14 positioned on the bottom side of the resistant heating element. A ceramic powder 19 is loaded upon the resistant heating element 20. Then, as shown in FIG. 5c, the ceramic powder is press-molded uniaxially by a top force 18B and the bottom tool 18A, to provide a ceramic shaped body 21. Then, as shown in FIG. 5d, the bottom tool 18A is elevated to take out the ceramic shaped body 21.

Then, the ceramic shaped body 21 is sintered to densify the ceramic into a disc-shaped ceramic substrate. The back side of this ceramic substrate is ground-finished. Thus, a ceramic heater is obtained. It is preferable to sinter the ceramic shaped body 21 by means of hot-pressing. Alternatively, sintering may be conducted by normal pressure sintering, or hot isostatic pressing after a preliminary normal pressure sintering.

According to the above-described example, since the untreated convolution 13 is confined in the groove 15a and then heat-treated, the resistant heating element is shape-stabilized in the planar pattern. Therefore, the resistant heating element can be readily transported in a short time and placed on the preform 17. Since a convolution as described above readily deforms three-dimensionally, it has heretofore been very difficult to fix the convolution on the preform 17 while maintaining its planar pattern. Additionally, according to the present invention, during or even after fixing the resistant heating element, positional deviation of the resistant heating element is reduced, whereby performance of uniform heating over the heating surface of the ceramic heater also has been improved.

Furthermore, deterioration or denaturing of the untreated convolution 13 can be decreased by heat-treating the untreated convolution 13 under a non-oxidative atmosphere. As a dense ceramic constituting the substrate, mention may be made of, for example, silicon nitride, aluminum nitride, SIALON, or the like. According to the present inventors' study, the silicon nitride, inter alia, improves thermal shock resistance of heaters. Alternatively, the aluminum nitride provides a high corrosion resistance against halogenous corrosive gases. As a high melting point metal for composing the resistant heating element, tungsten, molybdenum and alloys thereof are preferred. The untreated convolution 13 is heat-treated at a temperature not higher than the primary recrystallization commencement temperature of the high melting point metal composing the convolution. Heat treatment temperatures in excess of the primary recrystallization commencement temperature make the resistant heating element 12 brittle.

Figure 6:
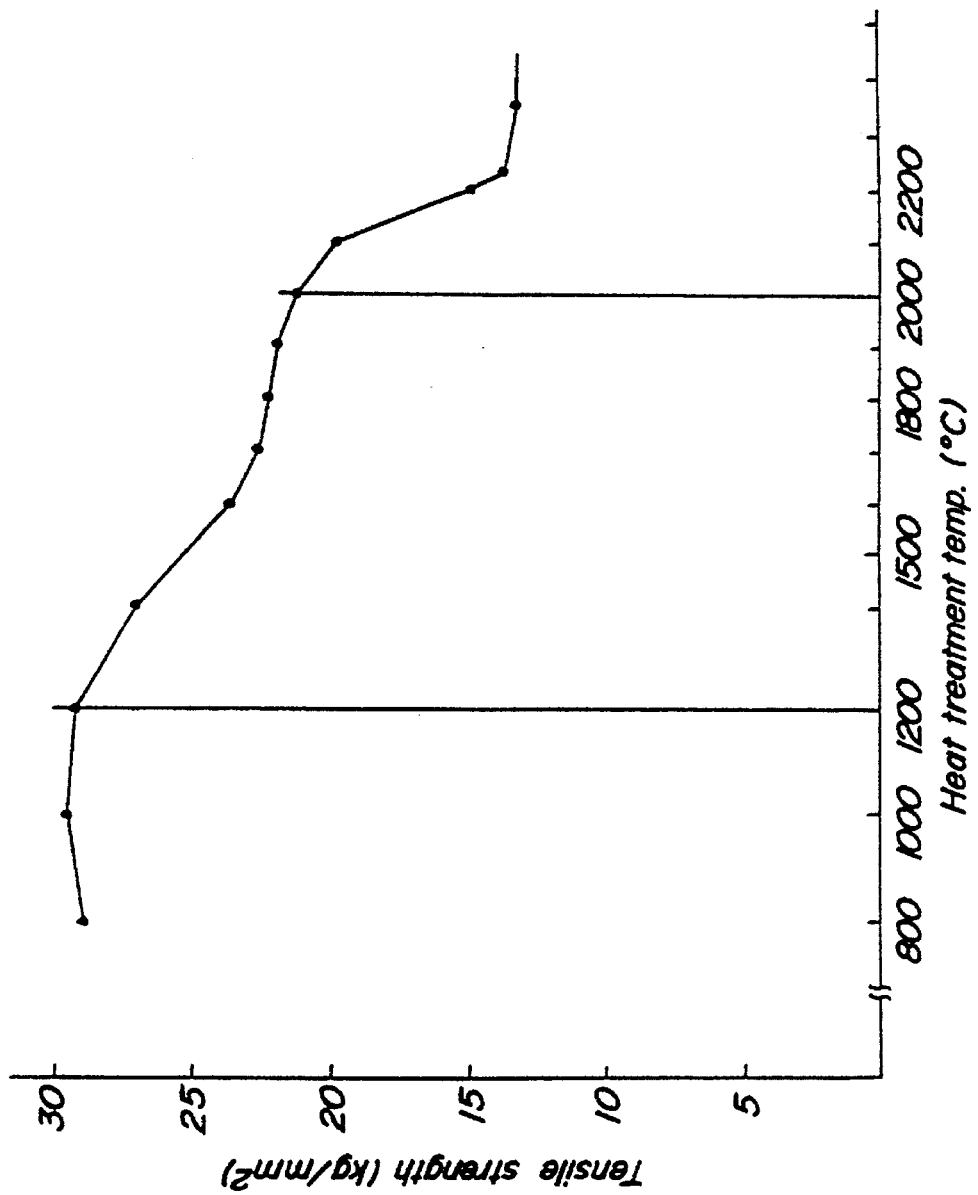
FIG. 6 is a graph showing a relation between strength of a tungsten filament and heat treatment temperatures.

With respect to a tungsten filament, the relation between the heat treatment temperature and the strength is shown in FIG. 6. When the heat treatment temperature exceeds about 1,200° C., the tensile strength begins to decrease. Accordingly, approximately 1,200° C. is considered to be the primary recrystallization commencement temperature. At about 1,500° C., the primary recrystallization has been almost completed. Then, in the region of the heat treatment temperatures ranging from about 2,000° C. to about 2,200° C., the tensile strength remarkably decreases again. From the above, it is considered that the secondary recrystallization commencement temperature is about 2,000° C. In fact, its metallostructure was observed after heat treatment, and it has been found that fibrous structure has been broken and the secondary recrystallization takes place at the heat treatment temperature of 2,150° C. When the heat treatment temperature is 2,350° C., only a secondary recrystallized structure is observed, which proves that the secondary recrystallization has been completed.

Furthermore, the higher the strength of the resistant heating element after heat treatment, the better. So, it is required to minimize the deterioration or denaturing caused by heat treatment of the resistant heating element. For this purpose, it is preferable to conduct the above heat treatment at a temperature not higher than the primary recrystallization commencement temperature of the high melting point metal.

As a material for the mold 15, those resistant to denaturing or deterioration caused by the above heat treatment are used. In particular, ceramics, such as alumina, silicon carbide, silicon nitride or the like, or high melting point metals, such as stainless steel, nickel, tungsten or the like, are preferred.

Specific experimental results will be shown hereinafter.

According to a process as shown in FIGS. 3a–4b, a convolution 13 was heat-treated and, according to a process as shown in FIGS. 5a–5d, a disc-shaped ceramic shaped body was produced. This ceramic shaped body was sintered to provide a disc-shaped ceramic heater for 8 inch use. In this instance, the mold 15 was shaped with a high purity alumina ceramic. Atmospheres as shown in Table 1 were used when the untreated convolution 13 was heat-treated and the heat treatment temperature was varied as shown in Table 1. The heat treatment time was one hour. As the material for the ceramic shaped body, a silicon nitride powder was employed and as the material of the spiral coil 12, a tungsten filament was employed. This tungsten filament had a thickness of 0.5 mm and a distance between successive coils of 2.5 mm.

After the heat treatment, the surface condition and the presence of brittleness were examined. The resistant heating element was transferred from the mold 15 onto a preform 17 and placed thereon. Then, the shaping operation was conducted as shown in FIGS. 5a–5d. After sintering, the location of the resistant heating element in the ceramic substrate was examined by X-ray to determine positional deviation from the objective position, which is shown in Table 1. Alternatively, the same examination as the above was conducted also in the case where the above heat treatment was not conducted. These results are shown in Table 1.

TABLE 1

| Atmosphere during heat treatment | Heat treatment temperature (°C.) | Change observed on surface after heat treatment | Positional deviation from loop-line of resistant heating element (mm) | Coil embrittlement (°C.) |
| --- | --- | --- | --- | --- |
| $10^{-3}$–$10^{-2}$ torr. | 800 | slight discoloration | 0 | nil |
| $10^{-3}$ torr. or less | 800 | nil | 0 | nil |
| Nitrogen | 800 | nil | 0 | nil |
| Hydrogen | 800 | nil | 0 | nil |
| $10^{-3}$ torr. or less | 700 | nil | maximum: 2 | nil |
| $10^{-3}$ torr. or less | 650 | nil | maximum: 6 | nil |
| $10^{-3}$ torr. or less | 900 | nil | 0 | nil |
| $10^{-3}$ torr. or less | 1000 | nil | 0 | a little |
| $10^{-3}$ torr. or less | 1250 | nil | 0 not positioned on predetermined loop-line | appreciable nil |

Alternatively, it is preferable to conduct the above heat treatment at a temperature not lower than 800° C. in order to shape-stabilize the resistant heating element.

In the case where the high melting point metal is tungsten, if the above heat treatment is conducted at 800° C.–900° C., a sufficient shape-stability can be provided, without deteriorating the resistant heating element.

In the present invention, the convoluted spiral coil is heat-treated under a non-oxidative atmosphere. Such a non-oxidative atmosphere includes vacua of less than $10^{-3}$ torr., a hydrogen atmosphere, an inert gas atmosphere, such as nitrogen, argon or the like.

In the case where the present invention was not applied, the positional deviation of the resistant heating element was increased and the performance of uniform heating over the heating surface was deteriorated. The present invention much improved in these respects. In addition, it was found that if the heat treatment of the resistant heating element was conducted according to the present invention, the resistant heating element was able to be readily fixed on the preform 17 in a short time.

In each of the above working examples, the whole body of the mold was put into an oven and heated. Alternatively, after the groove of the mold has received the resistant heating element, if an electric power is supplied to the resistant heating element to thereby heat the resistant heating element itself, the resistant heating element also can be heat-treated by its own generated heat. This manner is preferred, because the resistant heating element can be readily heat-treated in a short time.

The present inventors have found the followings with respect to the above manner of heat treatment. As a material of the spiral coil, a tungsten filament was employed. This tungsten filament had a thickness of 0.5 mm and a distance between successive coils of 2.5 mm. As shown in FIGS. 3a–4b, a convoluted spiral coil was placed in a mold. In this instance, the end of the convolution 13 was connected with a bolt-type terminal 21 as shown in FIG. 7, and the terminal 21 was screwed into a nut-type terminal 22. The mold was formed from a high alumina fibrous, heat-resistant inorganic material. The resistant heating element was placed in the groove of the mold and the terminal 22 was connected with a power supply cable 23 in a vacuum chamber. A conduit was formed in a predetermined spot of the mold and a thermocouple was inserted in the conduit. The power supply cable 23 and the thermocouple were sealed hermetically and led to the outside. The vacuum chamber was evacuated by a turbo molecular pump to bring the vacuum degree in the vacuum chamber down to the order of $10^{-4}$ torr. Using SLIDAC (trademark), power was supplied to make the resistant heating element to radiate heat. This was held for an hour, while adjusting the output of SLIDAC so as to control the temperature indicated by the thermocouple at 800° C.

With the thus obtained heat-treated resistant heating element, a disc-shaped ceramic shaped body was manufactured according to a process as shown in FIGS. 5a–5d, which was then sintered to provide a disc-shaped ceramic heater for 8 inch use. As the material for the ceramic shaped body, a silicon nitride powder was employed. Then, the same experiment as described above was conducted and a good surface condition and no brittleness, of the resistant heating element, were observed. No positional deviation of the resistant heating element in the ceramic substrate was observed.

Alternatively, in the second embodiment of the present invention, the substrate is preferably a board and more preferably a board having a ring-shape in a plan view thereof, particularly, an annular shape.

When the substrate is a board having an annular shape in the plan view, the spiral coil preferably extends continuously towards the peripheral direction in the plan view. More preferably, the substrate is disc-shaped and the spiral coil extends continuously towards the peripheral direction in the plan view. In this case, more preferably, the spiral coil continuously extends towards the peripheral direction to form a convolution. In this case, more preferably, the every loop line of the convolution is arranged nearly concentric with each other.

In the case where the substrate is disc-shaped and the spiral coil extends continuously towards the peripheral direction in the plan view, the embedded state according to the present invention can be expressed alternatively as follows.

Around the center of the disc-shaped substrate as a common vertex, the disc-shaped substrate is divided into sectoral domains with an equal vertical angle. When the number of coils of the spiral coil segments existing in each sectoral domain is determined, the relation of the difference of the maximal value and minimal value with the mean value, of all the determined numbers of coils satisfies the formula:

(maximal value−minimal value)/mean value≦0.1.

Under this condition, the total lengths of the spiral coil segments existing in the sectoral domains, respectively, are equal to each others.

However, there also may be the case where the total length of the spiral coil segments existing in each sectoral domain slightly varies from others. In such a case, with respect to the spiral coil segments existing in each sectoral domain, the total length and the number of coils per a unit length are determined, and then the above-described maximal value, minimal value and mean value are calculated. This number of coils per a unit length is a quotient obtained by dividing the total number of coils by the total length, of the spiral coil segments existing in each sectoral unit. Therefore, whatever the unit length may be, it does not have anything to do with the relation of the maximal and minimal values with the mean value, so that in the above calculation, the unit length can be decided as, for example, 1 cm. The number of the sectoral domains may be in the range of 4–24 and the optimal number is 12.

The dense ceramic that composes the substrate is preferably a nitride-based ceramic, such as silicon nitride, aluminum nitride, SIALON, or the like. According to the present inventors' study, if silicon nitride is employed, the heaters are provided with a high thermal shock resistance. Alternatively, if aluminum nitride is employed, a high corrosion resistance against halogenous corrosive gases can be provided. As a metal which constitutes the spiral coils, high melting point metals are preferred particularly in high temperature uses, and more preferably, tungsten, molybdenum and alloys thereof.

As the spiral coil, those having various shapes can be used. Coil springs having a coiled spring shape, since they are readily available, are preferred. In these spiral coils, the filament is coiled into a spiral shape which is nearly circular shape when it is viewed from the longitudinal direction thereof. However, the transverse sectional shape of the spiral coil can be oval, rectangular or the like, instead of circular.

A further specific example is detailed below.

FIG. 8 is a plan view showing a spiral coil material 25 having a shape of coil spring. In the spiral coil material 25, the filament is coiled into a spiral shape consisting of coils nearly circular when the spiral coil is viewed from the longitudinal direction thereof. At the stage of FIG. 8, the spiral coil material 25 has a relatively small distance between successive coils in the longitudinal direction thereof, so that the number of coils per a unit length is increased. In this experimental example, tungsten was used. This tungsten filament had a thickness of 0.5 mm and a distance between successive coils of 2.5 mm.

Then, an untreated convoluted spiral coil was held in a predetermined planar pattern. As a means therefor, any discretional methods can be adopted. However, it is preferred to place the convolution in a groove provided along a predetermined planar pattern on a mold. Then, with respect to the number of coils per a unit length determined of the untreated convolution, the value of "(maximal value−minimal value)/mean value" was changed as described below.

Specifically, the untreated convolution was held as shown in FIGS. 9, 10a and 10b. At the outset, with a jig, the spiral coil material 25 was extended, and an untreated convolution 29 having a planar pattern as shown in FIG. 9 was produced.

The pattern prepared in this example is for a two-zone heating type heater. Namely, one of three columnar terminals 28 is connected with the outermost end of the untreated convolution 29, another one is connected with the central end of the convolution 29 and the remaining one is connected to a midway portion therebetween. In the convolution 29, the loop 29a in the outermost portion has a small distance between successive coils, so that the number of coils of the spiral coil is relatively increased. The loops 29b in the intermediate portion between the outermost loop 29a and the midway terminal 28 have an increased distance between successive coils, and the loops 29c in the inside portion have relatively a decreased distance between successive coils. Namely, the outermost portion 29a, intermediate portion 29b and inside portion 29c correspond to the domains defined before, respectively, in the present invention. In all the domains, the envisaged numbers of successive coils are equal to each others.

A disc-shaped mold 27 as shown in FIG. 9 was prepared. On the surface side of the mold 27, a groove 33 with a nearly rectangular, transverse section is formed. The groove 33 has the same planar pattern as that of the untreated convolution 29 was formed.

At the outset, the number of coils of the untreated convolution 29 was determined. Then, the untreated convolution 29 was laid in the groove 33.

The mold 27 has a continuous ridge 34 also having a nearly rectangular, transverse section between the loop-lines of the groove 33. On the mold 27, in this example, a threaded hole 32 is formed at every intersection of the ridges 34 and 6 phantom diametral lines 31 extending through the center of the mold 27. Each of the phantom lines 31 makes an angle of 30° with the adjacent phantom lines 31. Consequently, the mold 27 is divided by 6 phantom lines 31 into sectoral unit domains: 30A, 30B, 30C, 30D, 30E, 30F, 30G, 30H, 30I, 30J, 30K and 30L.

The length of the spiral coil segments existing in each unit domain defined by the phantom lines 31, is determined. Then, with reference to the number of coils determined above, the number of coils of the spiral coil segments to be embedded in each unit domain is decided by calculation. Then, the untreated convolution 29 is laid in the groove 33 so that the number of coils may agree with the above calculated value, and the untreated convolution 29 is secured at selected portions. Such a securing means is also not particularly limited, which will be explained hereinafter.

Then, the shape of the untreated convolution 29 was adjusted such that the value of "(maximal value−minimal value)/mean value" agreed with the above-described value, when the number of coils of the spiral coil segments of the untreated convolution 29 existing in each unit domain was measured. Then, in this state, the untreated convolution 29 was fixed.

In this example, a fixing member was fitted into the threaded hole 32 and hooked to secure the untreated convolution, whereby the distribution of the number of coils of the untreated convolution 29 was set in the above value. By the above means, the shape of the untreated convolution 29 can be maintained very easily and conveniently, and this fixing operation can be also readily achieved.

More specifically, the untreated convolution 29 was secured as shown in FIGS. 10a and 10b. Namely, a bolt 36 was screwed into the threaded hole 32, remaining the head of the bolt 36 protrude above the ridge 34. The fixing member 37 of this example is a plate nearly rectangular. This fixing member 37 is provided on its protruding end with a claw 37a which hooks the convolution 29. The fixing member 37 is set by means of a nut 35 screwed on the bolt 36.

In FIG. 9, a state before setting the fixing member 37, bolt 36 and nut 35 is shown, for convenience' sake. Because, if the value of "(maximal value−minimal value)/mean value" falls within the envisaged range, the spot for setting the fixing member 37 may be changed appropriately in accordance with the state of the untreated convolution 29, so that the spots should be limited to a minimal number as required from the standpoint of working efficiency. In this respect, as shown in this example, if the threaded hole 32 is formed on every intersection of phantom lines extending radially from the center of the mold 27 and the ridges 34, the setting spot of the fixing member 37 can be freely chosen from these threaded hole positions, so that it is advantageous from the working point of view.

Alternatively, the untreated convolution 29 can be secured as shown in FIGS. 11a–11b. Namely, a hole 98 is formed at a predetermined spot in the groove 33. Then, a guide pin 99 as a fixing member is positioned by inserting its lower end into the hole 98. The convolution 29 contacts this guide pin 99 at a point 100. Thus, like the example shown in FIGS. 10a and 10b, the number of coils of the convolution 29 is set to a predetermined number so as to satisfy the aforementioned condition.

Figure 12:
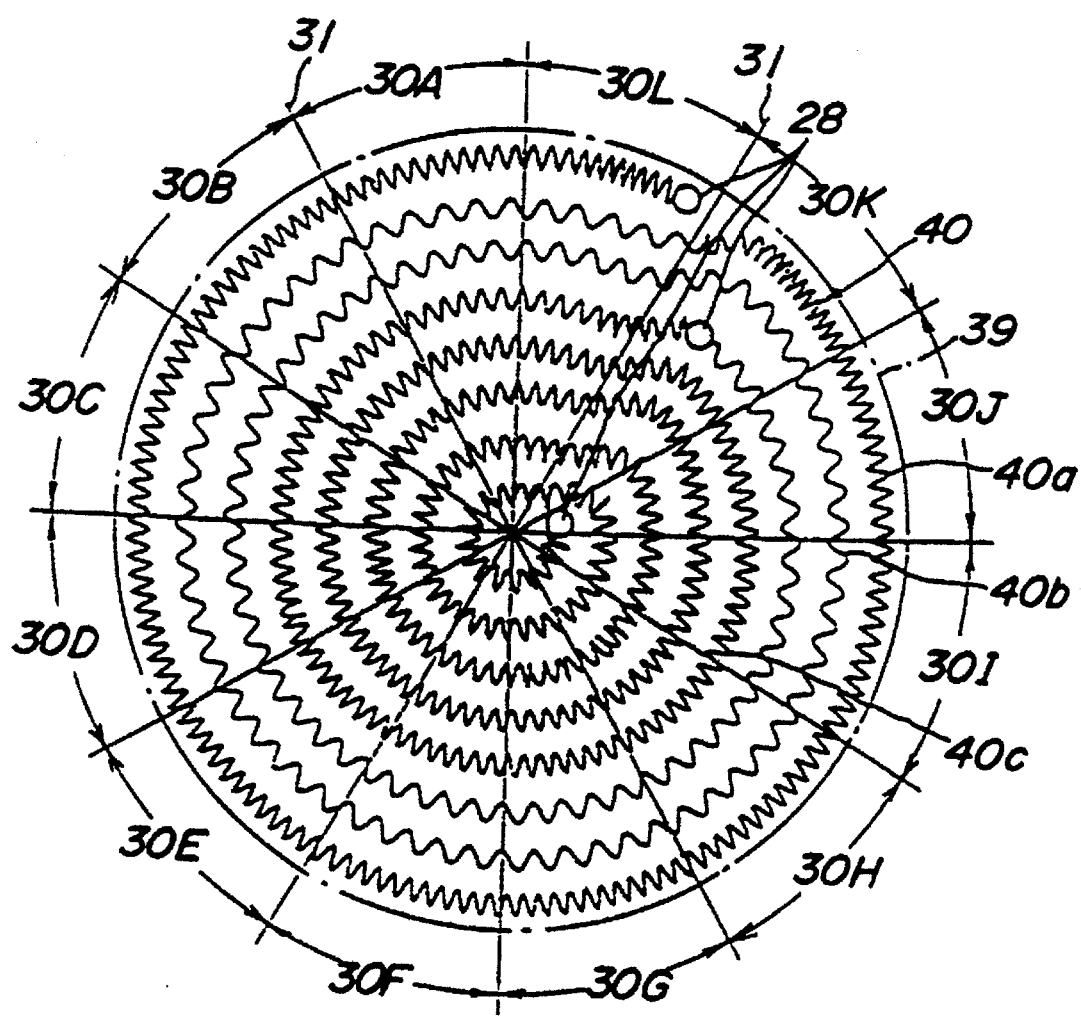
FIG. 12 is a plan view illustrating a layout of a convolution 40 embedded within a disc-shaped ceramic substrate 39.

Then, the untreated convolution 29 was heat-treated and the convolution 40 shown in FIG. 12 was obtained. The convolution 40, like the untreated convolution 29, comprises an outermost portion 40a, an intermediate portion 40b and an inside portion 40c. This resistant heating element is embedded within a ceramic shaped body and then the ceramic shaped body is sintered.

At the outset, a ceramic powder was charged onto a bottom tool and once pressure molded to provide a preform. Holes for receiving a terminal 28 were bored and the convoluted resistant heating element 40 was placed on the preform. During this placing step, the convolution 40 was laid with the terminal 28 positioned on the bottom side thereof. Then, a ceramic powder was loaded upon the convolution 40. Then, the ceramic powder was press-molded uniaxially to provide a ceramic shaped body.

Then, the ceramic shaped body was sintered to provide a disc-shaped ceramic substrate. The back side of this ceramic substrate was ground-finished. Thus, a ceramic heater was obtained. It is most preferred to sinter ceramic shaped bodies by means of hot-pressing. Alternatively, sintering may be conducted by normal pressure sintering, or hot isostatic pressing (HIP) after a preliminary normal pressure sintering. In this experimental example, silicon nitride was employed as a ceramic.

By heat-treating the untreated convolution 29 under a non-oxidative atmosphere, the resistant heating element is shape-stabilized in the planar pattern. Therefore, the convolution 40 of the resistant heating element can be readily transported in a short time from the mold onto the preform, when it is mounted on the preform. Since an untreated convolution 29 as described above is readily deformable three-dimensionally, it has heretofore been a very difficult work to lay it on the preform while maintaining its planar pattern.

Additionally, since the untreated convolution 29 is heat-treated under a non-oxidative atmosphere, deterioration or denaturing of the untreated convolution 29 can be restricted.

The untreated convolution 29 is heat-treated at a temperature not higher than the primary recrystallization commencement temperature of a high melting point metal which comprises the convolution. Heat treatment temperatures in excess of the primary recrystallization commencement temperature will make the resistant filament which constitutes the convolution brittle.

With respect to a tungsten filament, when the heat treatment temperature exceeds about 1,200° C., the tensile strength begins to decrease. Accordingly, approximately 1,200° C. is considered to be the primary recrystallization commencement temperature. At about 1,500° C., the primary recrystallization has been almost completed. Then, in the region of the heat treatment temperatures ranging about 2,000° C. to about 2,200° C., the tensile strength remarkably decreases again. From the above, it is considered that the secondary recrystallization commencement temperature is about 2,000° C.

In fact, the metallostructure was observed after heat treatment, and it has been found that the fibrous structure has been broken and the secondary recrystallization takes place at a heat treatment temperature of 2,150° C. When the heat treatment temperature is 2,350° C., only a secondary recrystallized structure is observed, which proves that the secondary recrystallization has been completed.

Furthermore, the higher the strength of the resistant heating element after heat treatment, the better. So, it is required to minimize deterioration or denaturing caused by heat treatment. For this purpose, it is preferred to conduct the above heat treatment at a temperature not higher than the primary recrystallization commencement temperature of the metal.

Alternatively, it is preferred to conduct the above heat treatment at a temperature not lower than 800° C. in order to provide the convoluted resistant heating element 40 with shape-stability. In the case where the high melting metal is tungsten, if the above heat treatment is conducted at 800° C.–900° C., a sufficient shape-stability can be provided, without deteriorating the resistant heating element.

For heat-treating the untreated convolution 40 under a non-oxidative atmosphere, such a non-oxidative atmosphere includes vacua of less than $10^{-3}$ torr., hydrogen atmosphere, an inert gas atmosphere such as nitrogen, argon or the like.

As a material for the mold, those resistant to denaturing or deterioration caused by the above heat treatment are used. Specifically, ceramics, such as alumina, silicon carbide, silicon nitride or the like, or high melting point metals, such as stainless steel, nickel, tungsten or the like, are preferred.

Thus, a disc-shaped ceramic heater for 8 inch use was obtained. The untreated convolution 29 was heat-treated at a temperature of 800° C. for one hour.

Then, the layout of the resistant heating element within the disc-shaped ceramic substrate was examined by X-ray and the distribution of the number of coils of the convolution 40 was determined. More specifically in FIG. 12, 6 phantom diametral lines extending through the center of the disc-shaped substrate 39 are shown. Each of the phantom lines 31 makes an angle of 30° with the adjacent phantom lines 31. Thus, the disc-shaped substrate 39 is divided by 6 phantom lines 31 into sectoral unit domains: 30A, 30B, 30C, 30D, 30E, 30F, 30G, 30H, 30I, 30J, 30K and 30L. These domains are similar to those shown in FIG. 9.

The number of coils per a unit length of the above-described untreated convolution 29 was determined. The values of "(maximal value–minimal value)/mean value" are shown in Table 2, respectively. Furthermore, with respect to a ceramic heater after sintering, the number of coils of the spiral coil segments of the convolution 40 existing in each unit domain was determined. Then, the maximal, minimal and mean values of all the determined numbers of coils were found. The values of "(maximal value–minimal value)/mean value" are shown, respectively.

With respect to each example of the ceramic heaters produced in this experimental example, heat was radiated so that the mean value of the temperatures over the heating surface rose to about 800° C. and the temperatures at 30 spots on the heating surface were measured by a radiothermometer. Thus, "difference between the maximal value and the minimal value of the measured temperatures" was calculated. The results are shown in Table 2.

Figure 13:
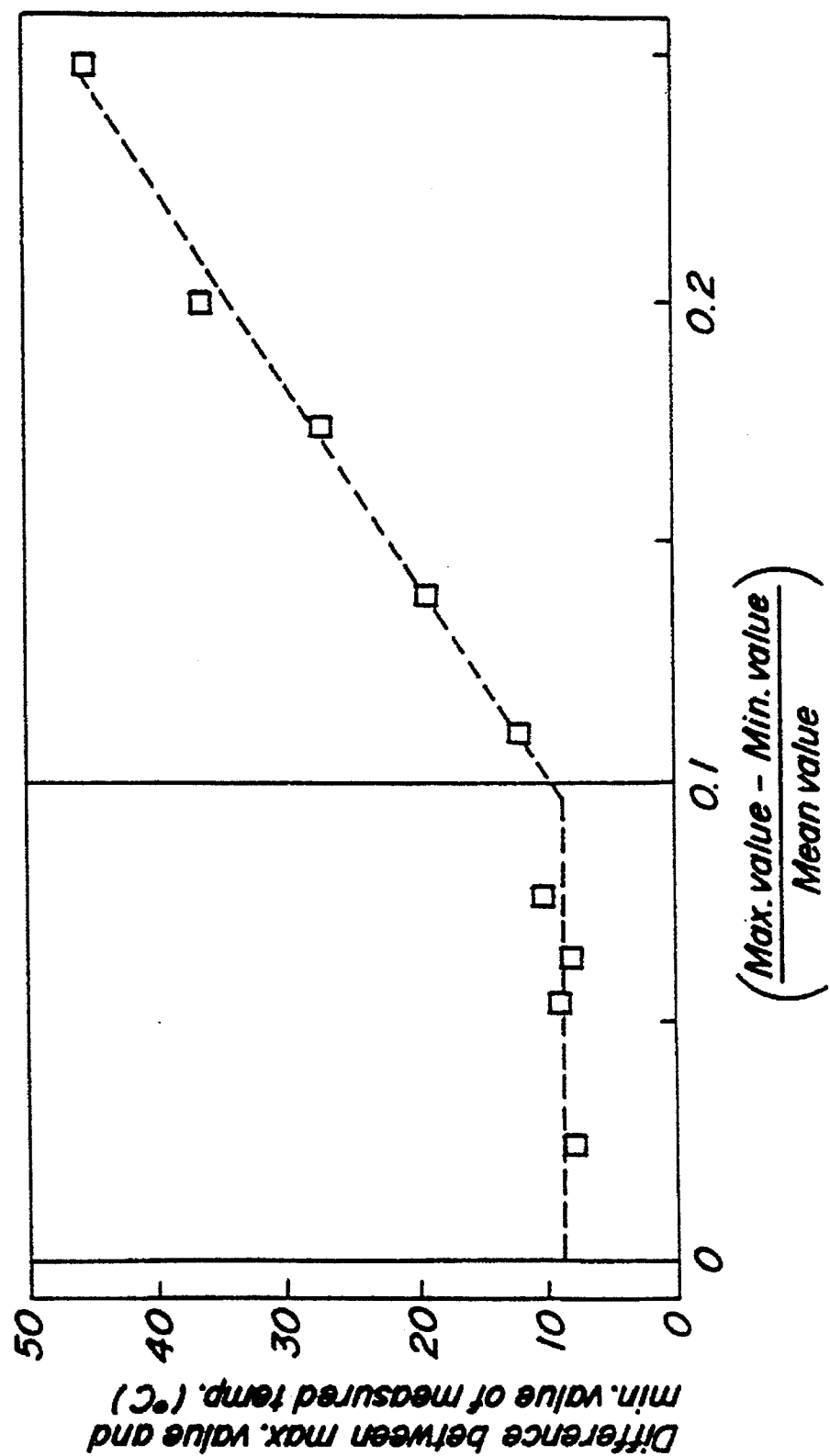
FIG. 13 is a graph showing a relation between a value of "(maximal value–minimal value)/mean value" with respect to the numbers of coils of spiral coil segments existing in unit domains and "the difference between the maximal value and minimal value of the measured temperatures", on a fired ceramic heater.

Furthermore, with respect to the number of coils of the spiral coil segments of the convolution 40 existing in each unit domain of the ceramic heaters after firing, the relation between "the value of (maximal value–minimal value)/mean value" and "the difference between the maximal value and the minimal value" is shown in the graph in FIG. 13.

TABLE 2

| Example No. | (max. value–min. value)/mean value of the numbers of coils of untreated convolution 29 | (max. value–min. value)/mean value of the numbers of coils of convolution 40 after sintering | Difference between max. value and min. value of measured temperature (°C.) |
|---|---|---|---|
| Comparative Example | | | |
| 1 | 0.165 | 0.248 | 45 |
| 2 | 0.121 | 0.200 | 36 |
| 3 | 0.095 | 0.174 | 27 |
| 4 | 0.063 | 0.139 | 19 |
| 5 | 0.060 | 0.11 | 12 |
| Example | | | |
| 6 | 0.029 | 0.076 | 10 |
| 7 | 0.050 | 0.054 | 9 |
| 8 | 0.032 | 0.024 | 8 |
| 9 | 0.050 | 0.063 | 8 |

As is understood from the results shown in Table 2 and FIG. 13, when "the value of (maximal value–minimal value)/mean value" of the numbers of coils is 0.1 or less with respect to all of the spiral coil segments of the convolution 40 existing in each unit domain of the ceramic heaters after firing, the difference between the maximal value and the minimal value of the measured temperatures on the heating surface of the ceramic heater remarkably decreases to about 10° C. Even if "the value of (maximal value–minimal value)/mean value" is controlled to decrease within the range of less than 0.1 with respect to the number of coils of the spiral coil segments of the convolution 40, the temperature gradient is not improved. However, if "the value of (maximal value–minimal value)/mean value" is increased to exceed 0.1, the temperature difference increases rapidly.

Further, as is understood by comparing "the value of (maximal value–minimal value)/mean value" obtained from the measured numbers of coils per a unit length of the untreated convolution 29, with "the value of (maximal value–minimal value)/mean value" obtained from the measured numbers of coils of the spiral coil segments of the convolution 40 existing in unit domains of the fired ceramic heaters, it has been found that if "the value of (maximal value–minimal value)/mean value" is controlled to be 0.05 or less with respect to the untreated convolution 29, ceramic heaters in the scope of the present invention can be readily manufactured.

Further according to the third embodiment of the present invention, an example relating to a planar embedding pattern of the resistant heating elements will be described.

Figure 14:
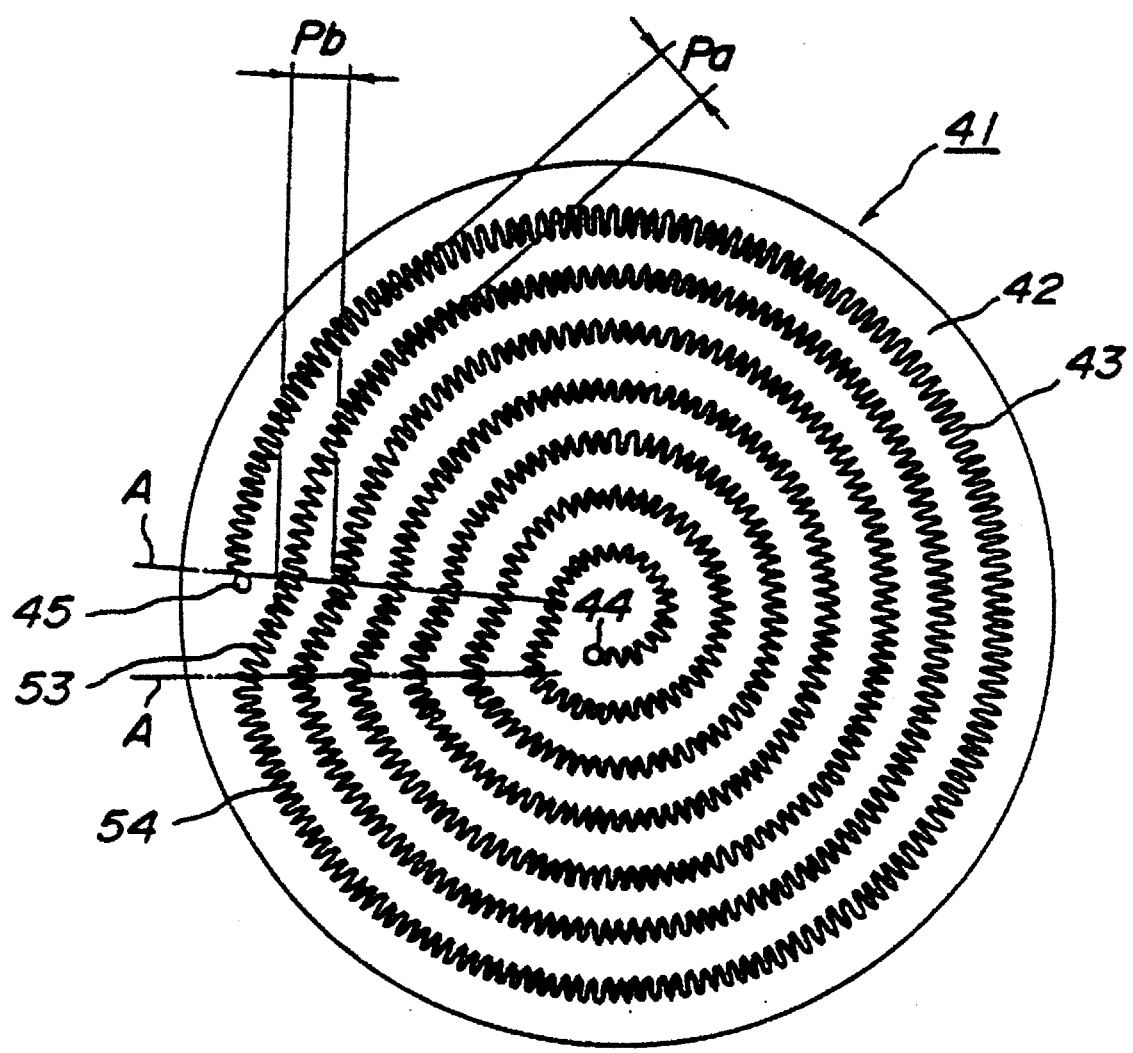
FIG. 14 is a perspective plan view showing an embodiment of the semiconductor wafer heating apparatus according to the present invention, showing the location of the resistant heating element.

Making reference to FIGS. 14 and 15, an embodiment of the semiconductor wafer heating apparatuses according to the present invention will be explained. In FIG. 14, a disc-shaped heating apparatus 41 has a structure comprising a dense, gastight inorganic substrate 42, such as silicon nitride, and a convoluted spiral resistant heating element 43, such as of tungsten-based metal or the like, embedded within the substrate. The resistant heating element 43 comprises concentric loops 54 differing in diameter from each other and connecting portions 53 which connect outer loops 54 in sequence with inner loops 54 to form a resistant heating element.

From the viewpoint of performance of uniform heating, the distance Pa between adjacent loops 54 should be approximately the same as the distance Pb between the adjacent connecting portions. Power can be supplied from the outside via lead wire 46 shown in FIG. 15 to both terminals 44 and 45 in the center and circumference, respectively, of the resistant heating element 43, to heat the disc-shaped heating apparatus up to, for example, about 1,100° C.

Figure 15:
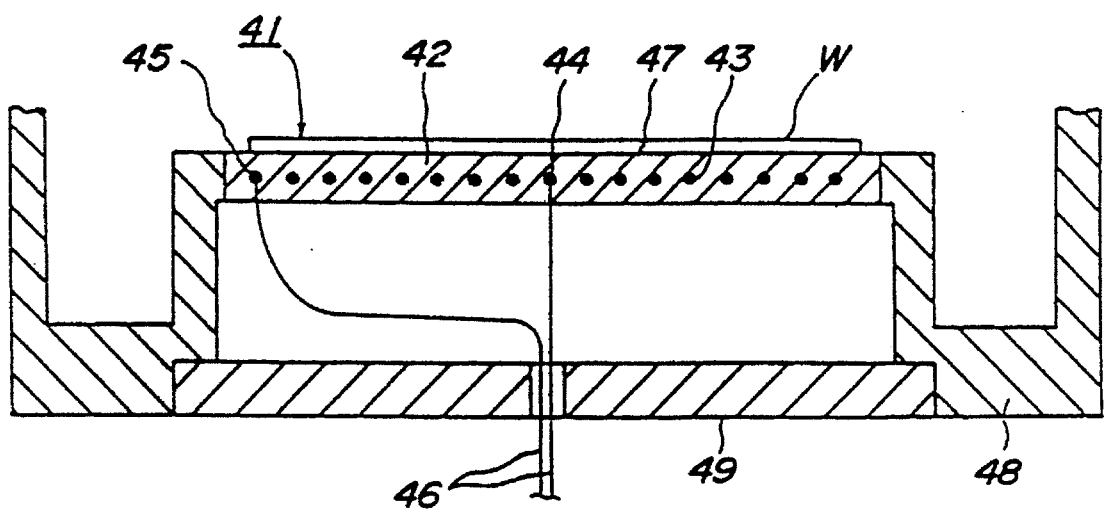
FIG. 15 is a vertical sectional view of the heating apparatus shown in FIG. 14.

FIG. 15 is a vertical cross-sectional view showing a thermo-CVD apparatus for manufacturing semiconductors, with a heating apparatus 41 of the embodiment of the present invention mounted thereon. As shown in FIG. 15, a wafer heating surface 47 is formed on the top surface of the heating apparatus 41. The wafer heating surface 47 has a dimension of, for example, 4–8 inches which is the same as the wafer or large enough for supporting the wafer. The chamber 48 is used for thermo-CVD to manufacture semiconductors. This chamber is attached firmly to the heating apparatus 41. The bottom of the chamber is blocked with a flange 49.

The material of the substrate 42 is required to be dense enough to prevent adsorption of deposition gases, so that materials having a water absorption of not more than 0.01% are preferred. Alternatively, though no mechanical stresses are applied, the material requires thermal shock resistance, withstandable cooling and heating in the range between normal temperature and 1,100° C. Accordingly, it is preferred to employ sintered bodies of a ceramic having a high strength at high temperatures, such as silicon nitride, SIALON, aluminum nitride, or the like.

Dense bodies are obtained effectively by firing the substrate 42 by means of hot-pressing or HIP.

Alternatively, the apparatuses for manufacturing semiconductors are required to prevent inclusion of alkaline earth metals therein. Therefore, as sintering aids used for the substrate 42, yttria, alumina, and ytterbium-based oxides are preferred, while it is not preferred to use alkaline earth metals, such as magnesium or the like.

As for the resistant heating elements 43 embedded within the substrate 42, it is appropriate to employ tungsten, molybdenum, platinum, or the like, which have high melting points and have excellent compatibility with silicon nitride. As the resistant heating elements, those having a shape, such as filament, thin sheet, or the like, are used. The wafer heating surface 47 is preferably smooth and, particularly in the case where a wafer W is set directly on the wafer heating surface 47, it is desired to make the flatness of the wafer heating surface 47 no more than 500 μm to prevent permeation of deposition gases to the back surface of the wafer W.

Figure 16:
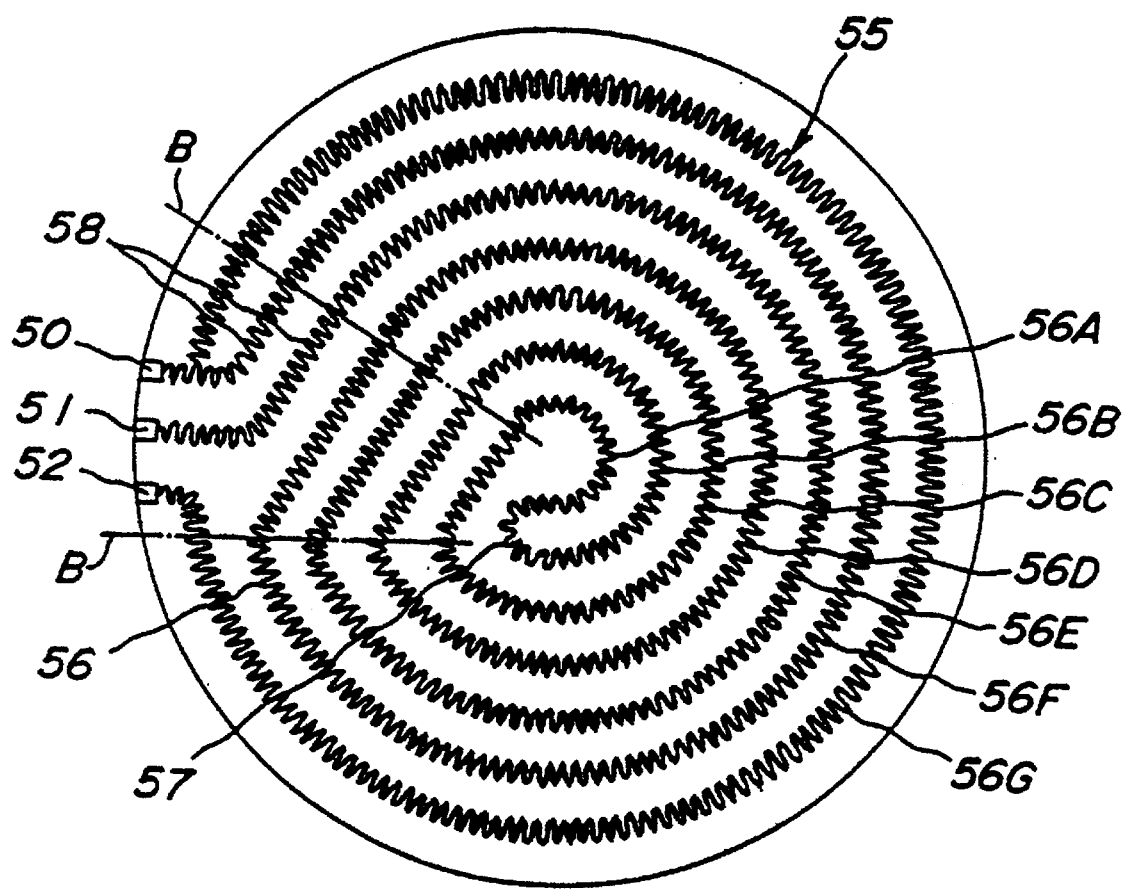
FIG. 16 is a perspective plan view showing another embodiment of the semiconductor wafer heating apparatus according to the present invention.

FIG. 16 shows another embodiment of the semiconductor wafer heating apparatuses according to the present invention.

The apparatus of this embodiment is constructed with a resistant heating element 55 comprising 2 series of filaments connected with one another in the vicinity of the center and an outermost peripheral filament. Namely, the innermost concentric loops 56A and 56B extend in the same direction and are connected with one another by a connecting portion 57, and the other end of the innermost loop 56A is connected with a tail end of the third concentric loop 56C. Thus, with every second loop, that is, the second loop and fourth loop, the third loop and fifth loop, and the fourth loop and sixth loop, are connected with each others in a head-to-tail fashion, respectively. Further, the free end of the sixth concentric loop is connected with a terminal 50, and the free end of the fifth concentric loop is connected with a terminal 51. Furthermore, one end of the seventh concentric loop is connected with a terminal 52 and the other end is connected to the terminal 50. Consequently, the concentric loop 56A is connected with loops 56B and 56C, respectively, the concentric loops 56B and 56D are connected, the concentric loops 56C and 56E are connected, and the concentric loops 56D and 56F are connected, with one another, respectively, and the concentric loop 56E is connected with the terminal 51, the concentric loop 56F is connected with the terminal 50, and the concentric loop 56G is connected with the terminals 50 and 52, respectively.

Two heating methods can be employed in this embodiment of the apparatus. One method is to supply power via the terminals 50 and 51. In this instance, the zone between the concentric loop 56A to the sixth concentric loop 56F can be heated. Another method is to supply power via the terminals 51 and 50, 52. In this instance, the zone between the concentric loop 56A to the outermost concentric loop 56G can be heated.

Thus, by dividing the heating zone into to 2 portions, heating can be conducted adequately maintaining the performance of uniform heating over the heating surface corresponding with the size of wafers. Additionally, the heating apparatus of the embodiment according to the present invention, since it has a structure comprising a series convoluted resistant heating element 55 turning back around the center, can be provided with the terminals 50, 51 and 52 in the vicinity of the circumference of the disc-shaped heating apparatus. Therefore, plate-like terminals or the like other than normal terminals can be employed, so that this heating apparatus is advantageous in power supply to the resistant heating element and effective in compaction of the wafer heating apparatuses.

Figure 17:
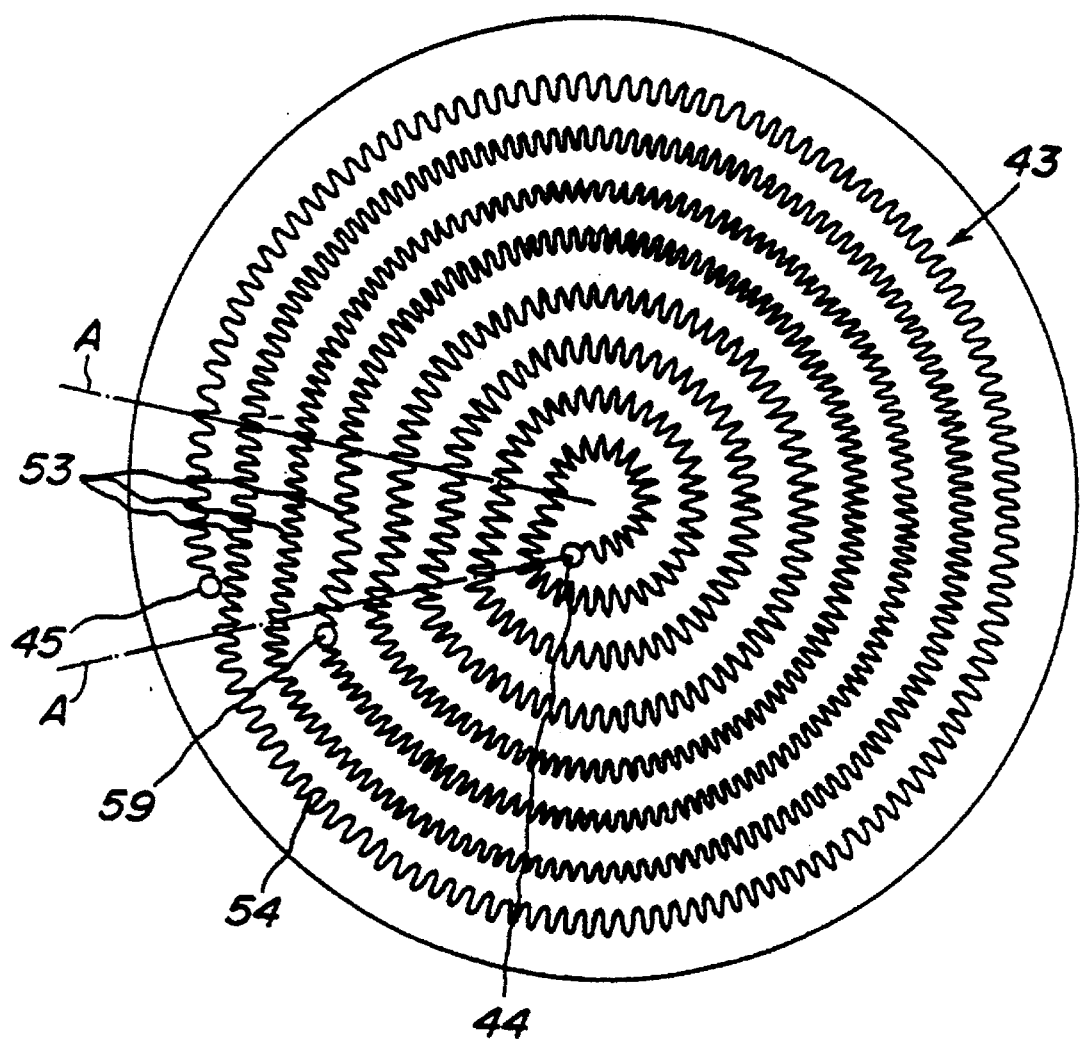
FIG. 17 is a perspective view showing a further different embodiment of the semiconductor wafer heating apparatus according to the present invention.

FIG. 17 shows a further different embodiment of the semiconductor heating apparatus according to the present invention. This embodiment of the heating apparatus has terminals 44, 45 for power supply, one on the end of the innermost concentric loop and the other on the outermost concentric loop, similar to the embodiment of the apparatus shown in FIG. 14, and is further provided with an additional terminal 59 on a midway portion therebetween.

In this embodiment, also similar to the embodiment of the apparatus shown in FIG. 16, heating can be conducted in two heating zones. Namely, if power is supplied via the terminals 44 and 45, the whole zone of the resistant heating element can be heated. If power is supplied via the terminals 45 and 59, the zone ranging from the terminal 45 to the terminal 59 can be heated.

Next, a result of a comparative experiment for temperature distribution over the wafer heating surface will be explained with respect to the semiconductor wafer heating apparatuses according to the present invention.

Figure 18:
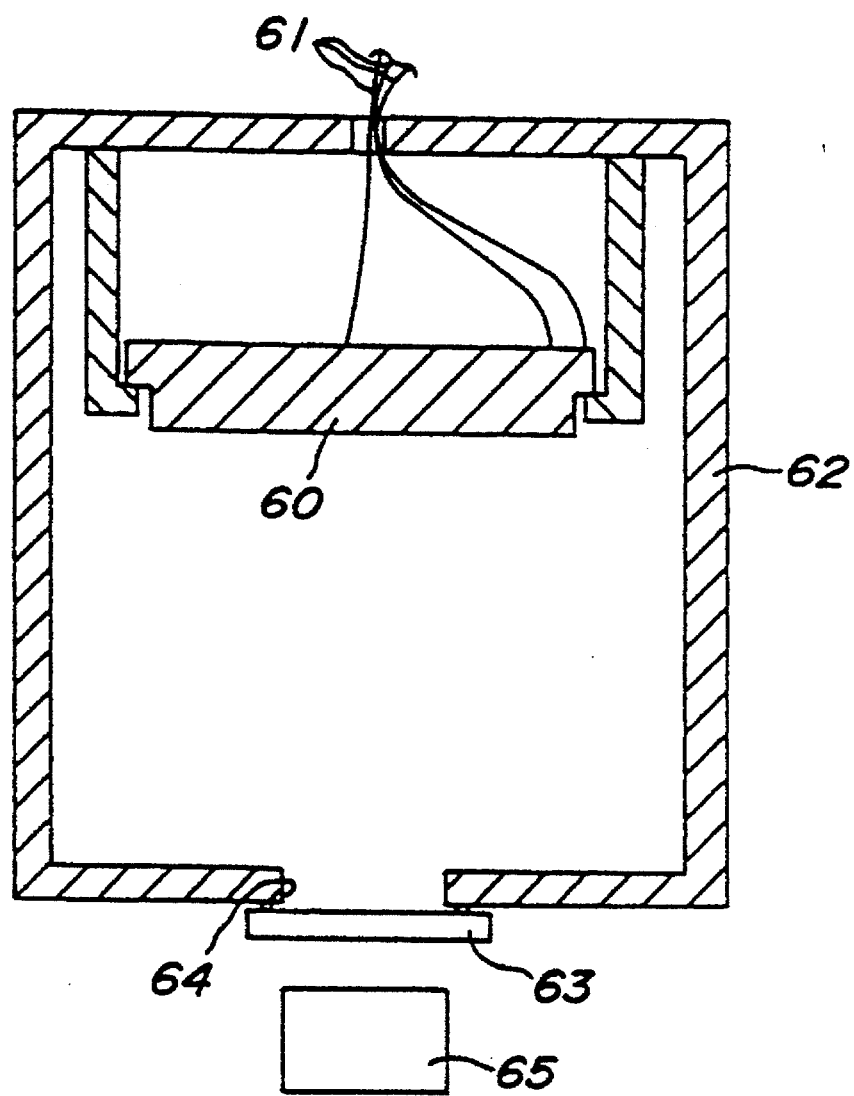
FIG. 18 is a cross-sectional view showing an apparatus which is used in a comparative experiment of a temperature distribution on the heating surface of the semiconductor wafer heating apparatus according to the present invention.

FIG. 18 shows an apparatus used in the comparative experiment. Inside a vacuum chamber 62, a heating apparatus 60 according to the present invention or comparative example is fixed. To this heating apparatus 60, power is supplied from lead wires 61. On the bottom of the vacuum chamber is provided an opening 64 on which a sapphire window 63 is fixed. An infrared camera 65 is arranged below the window 63.

In Comparative Example A1, the embedded pattern of the resistant heating element according to the present invention was concentric and one zone, and in Comparative Example A2, two zones. Alternatively, in Comparative Example B, the embedded pattern of the resistant heating element was convolute.

When measurement was conducted, the vacuum chamber was evacuated to a vacuum of $10^{-5}$ torr., heated by supplying power to the heating apparatus 60, and then the temperature distribution over the semiconductor heating surface was measured through the sapphire window 63 by the infrared camera. The measured values were shown by the breadth of the temperature distribution on the wafer heating surface when the temperature on the center of the heater was heated up to 400° C.

The experimental result is shown in Table 3.

TABLE 3

|  | Comparative Example A1 (concentric annular 1 zone) | Comparative Example A2 (concentric annular 2 zones) | Comparative Example B (convolute) |
| --- | --- | --- | --- |
| Breadth of temperature distribution on surface for heating semiconductor | 16° C. | 10° C. | 34° C. |

As shown in Table 3, in the heating apparatus of Comparative Example B wherein the embedded pattern of the resistant heating element was convolute, the breadth of the temperature distribution over the wafer heating surface was 34° C., while, in the case where the embedded pattern of the resistant heating element was concentrically looped, the breadth of the temperature distribution over the wafer heating surface was 16° C. Thus, the heating apparatus of Comparative Example A1 according to the present invention showed a breadth of the temperature distribution less than a half of that of the heating apparatus of Comparative Example B. Additionally, in the case of the 2-zone heating, the breadth of the temperature distribution of the wafer heating surface was further decreased to 10° C.

That the heating apparatus of Comparative Example B wherein the embedded pattern of the resistant heating element is convolute has an increased breadth of the temperature distribution, is attributable to the formation of a cool spot in the peripheral portion where the resistant heating element is absent.

Figure 19:
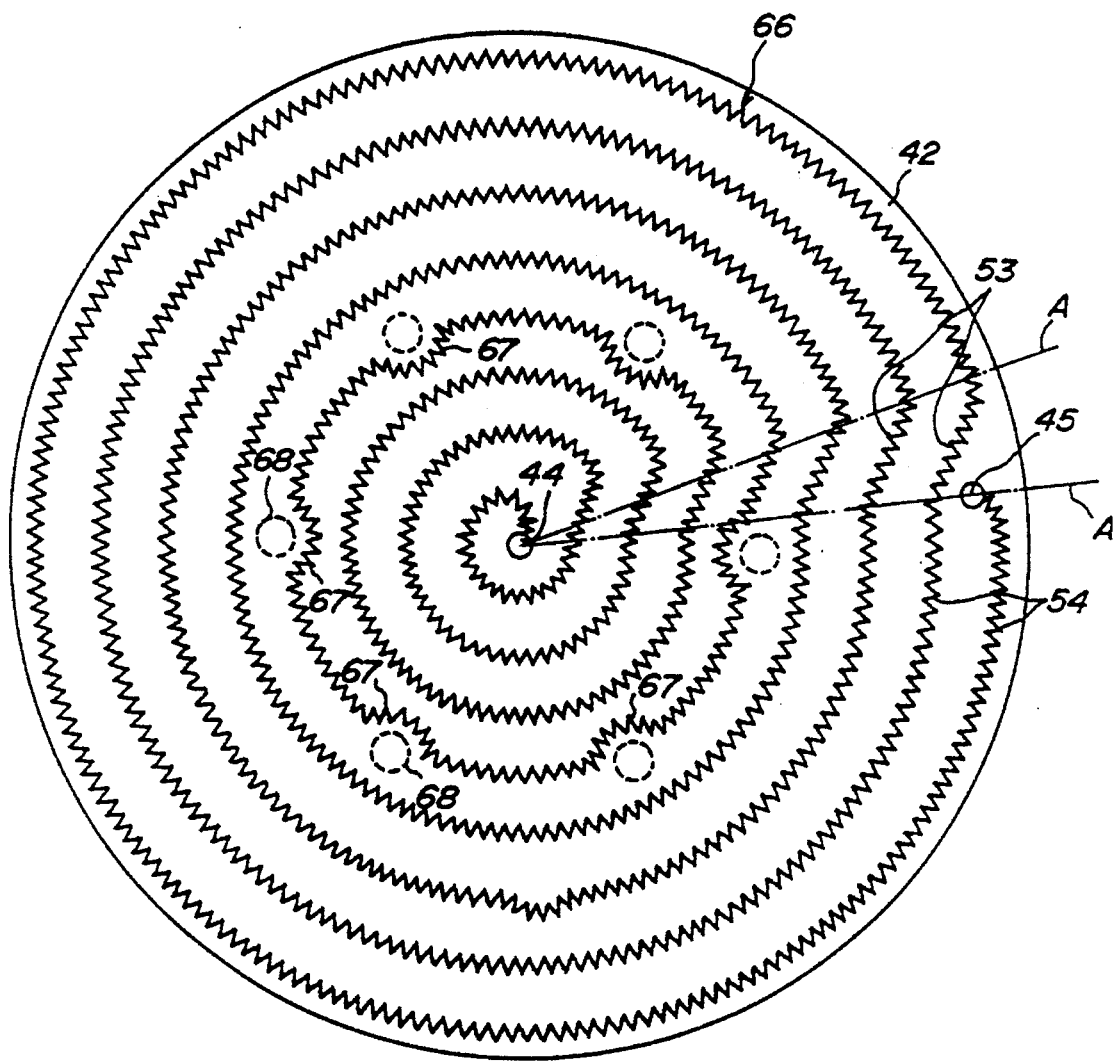
FIG. 19 is a perspective view showing a further different embodiment of the semiconductor wafer heating apparatus according to the present invention.

FIG. 19 is a plan view showing an embedding pattern of the resistant heating element in a heating apparatus in a further different embodiment.

A resistant heating element 66 is embedded within a ceramic substrate 42. Each of the loops 54 is arranged concentric with others. In a sectional zone between chain lines A, are provided connecting portions 53, each connecting concentric loops radially adjacent to one another. Terminals 44 and 45 are connected with the innermost end and outermost end, respectively, of the resistant heating element 66. However, in this embodiment, inward bent portions 67 are formed, for example, on 6 positions in total along the fifth loop from the peripheral side. In this example, the bent portions themselves are formed into a semicircle with an increased curvature. In the portion half-surrounded with the bent portion 67, a conduit or pit is bored.

Next, according to the fourth embodiment of the present invention, an example wherein the layout of an electroconducting element embedded in a ceramic substrate is detected by means of an X-ray photographing will be explained.

The present invention is preferably applicable not only to ceramic heaters but also electrostatic chucks comprising a ceramic substrate and an electrostatic chuck electrode embedded therein and high-frequency generating electrode members comprising a ceramic substrate and a metallic, high-frequency electrode embedded therein.

Figure 20:
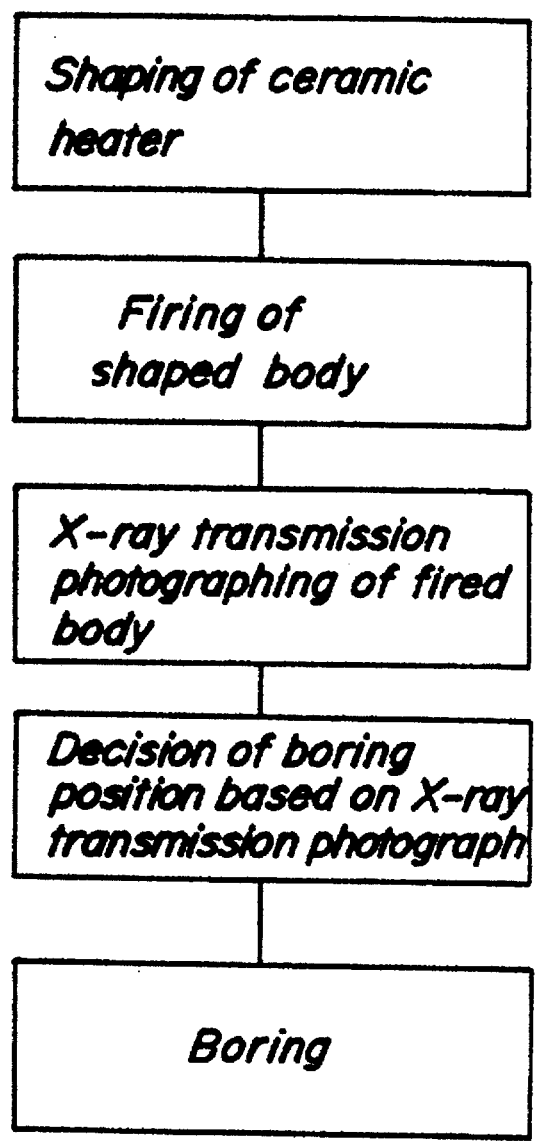
FIG. 20 is a process flow diagram showing an embodiment of the process for manufacturing ceramic heaters according to the present invention.

FIG. 20 is a process flow diagram illustrating an example of the process for manufacturing ceramic heaters utilizing the present invention. At the outset, according to a conventional process, a shaped body of a ceramic heater comprising a ceramic substrate and a resistant heating element embedded therein is provided by means of pressure molding. Then, the resulting shaped body is fired according to a conventional process. Then, an X-ray transmission photograph of the fired body is taken. During this photographing, it is preferred to set a surface provided with a terminal to face X-ray film. As an X-ray transmission photographing apparatus, any X-ray transmission photographing apparatus for industrial use can be used.

In the example of the X-ray film photograph shown in FIG. 21 (in the negative: FIG. 21, black and white colors are displayed in reverse for the sake of drafting) which has been taken with an X-ray transmission photographing apparatus, the image is larger than the real thing, because the X-ray emission source is a point light source. The deviation of the image on the photograph from an object is increased with increasing distance from the center. Here, an image 70 of a resistant heating element and images 71, 85 of terminals are on the X-ray film photograph 69. Therefore, before taking the X-ray transmission photograph, a metallic piece marker is attached to an end portion of the ceramic substrate, and the taken photograph is copied on a reduced scale. Then, deviation occurring during photographing can be corrected by registering the marker on the object with the image on the photograph. Thus, particularly positional deviations in the horizontal direction of the ceramic substrate can be effectively prevented.

Then, the thus corrected and copied image is transcribed onto a transparent sheet for OHP use, which is attached on the ceramic heater to confirm the location of the resistant heating element with respect to positions for boring. Boring is then conducted to provide a final ceramic heater product.

Figure 22A:
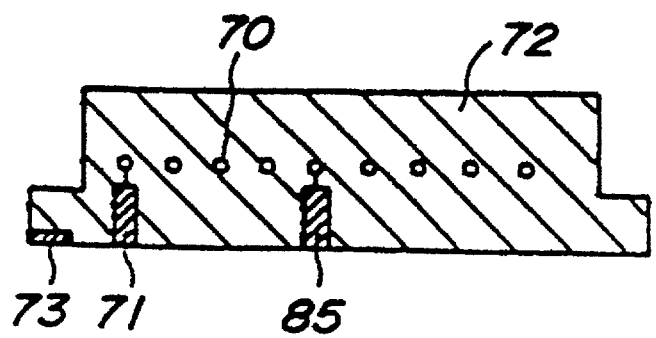
FIG. 22a is a vertical sectional view schematically showing an embodiment of the ceramic heaters manufactured according to the present invention.
Figure 22B:
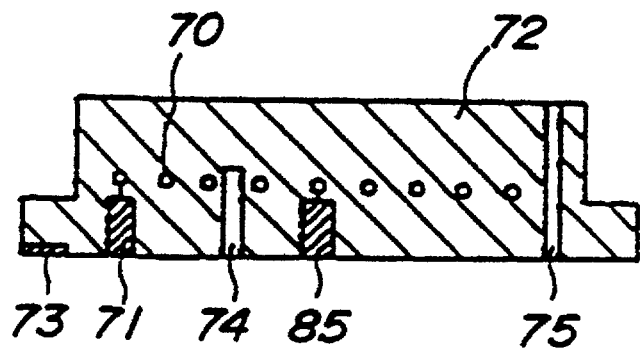
FIG. 22b is a vertical sectional view schematically showing a state of a conduit and pits formed in the above ceramic heater.

FIGS. 22a and 22b show constructions of an embodiment of a substrate and an embodiment of this substrate bored after firing, respectively, with respect to a ceramic heater according to the present invention. In the profiles shown in FIGS. 22a and 22b, the resistant heating element, since it has a shape of spiral coil, might not have been aligned in fact, on the cross-sectional view. In these figures, the cross-sections of the resistant heating element were depicted, for convenience sake, in alignment. Furthermore, though terminals, conduits and pits usually would not be positioned on the same cross-sectional plane, they were also depicted on the same cross-section, for convenience sake.

The substrate of the ceramic heaters according to the present invention shown in FIG. 22a has a structure, the same as conventional shaped bodies, comprising a dense, gastight inorganic substrate 72, such as silicon nitride or the like, and a resistant heating element 70 with a convolute shape, composed of a metallic material, such as tungsten, molybdenum or the like, embedded therein. With respect to this substrate, metallic terminals 71, 85 for power supply are provided on the central end and peripheral end, respectively, of the resistant heating element, and a metallic piece marker 73 composed of a highly dense metallic material, such as tungsten, molybdenum or the like, is further attached to a peripheral portion of the substrate. As shown in FIG. 22b, the ceramic heater hole-bored after firing is further provided with a pit 74 for positioning a thermocouple for temperature measurement and a conduit 75 for flowing gases therethrough from the back surface of the heater, at positions avoiding the resistant heating element 70. The conduit 74 and pit 75 can be provided in plurality, if required.

The material of the inorganic substrate 72 is preferably a dense body having a water absorption of not more than 0.01%, which is resistant to absorption of various substances on the surface thereof, in order to exhibit an excellent degassing characteristic in the case where it is used in high vacua. The material also requires a resistance to thermal shock to endure rapid heating and cooling in the range between normal temperature and 1,100° C. From these points of view, it is preferred to employ ceramics having a high strength at high temperatures, such as silicon nitride sintered body, SIALON, aluminum nitride, or the like. In addition, dense bodies are effectively obtained by firing the substrate 72 by means of hot-pressing or HIP processes.

Figure 23A:
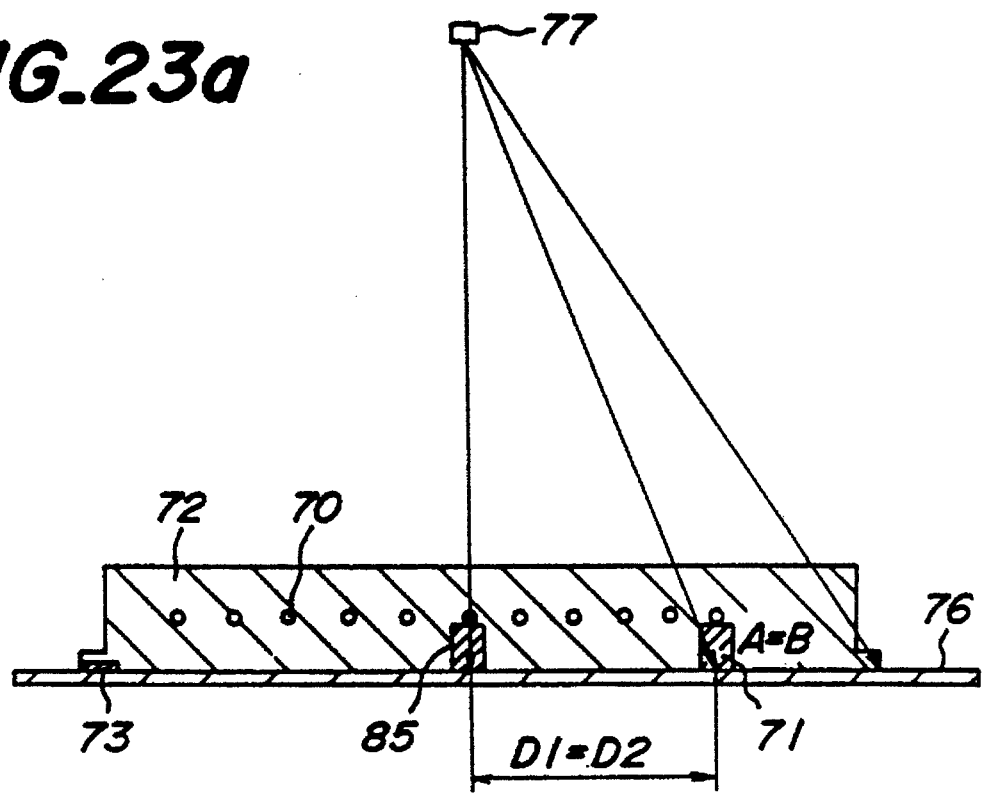
FIG. 23a is an illustrative view showing a photographing state of an X-ray transmission photograph used in the process of the present invention, arranging the substrate with terminals facing the photographic plate.
Figure 23B:
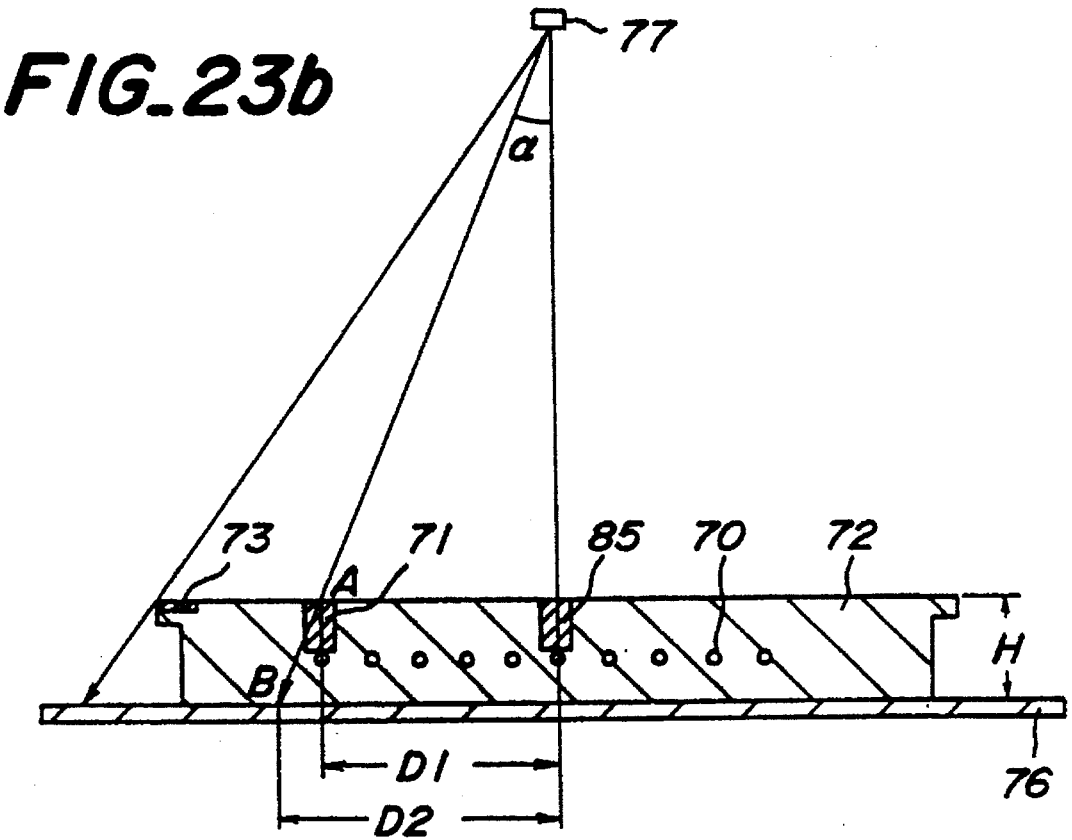
FIG. 23b is an illustrative view showing a photographing state of an X-ray transmission photograph in the process of the present invention, arranging terminals across the ceramic substrate from the photographic plate.

FIGS. 23a and 23b are both illustrative views showing a state of X-ray transmission photographing according to the present invention. FIG. 23a shows an optimal example.

Namely, in the example shown in FIG. 23a, the surface of the substrate 72 on which terminals 71, 85 for supplying power to the resistant heating element 70 are provided and a metallic piece marker 73 is attached is set to face an X-ray film 76 which receives X-ray irradiated from an X-ray source 77. Therefore, as shown in FIG. 23a, the real distance D1 between the terminals 71 and 85 agrees approximately with the projected distance D2 between the terminals 71 and 85 on the X-ray film 12. Accordingly, even based on the X-ray photograph, each of the terminals 71 and 85 can be exactly located with no error.

With respect to the location of the resistant heating element, though the position on the photograph is deviated from the real position, when the position of the peripheral terminal 71 is in agreement with the position of the outermost loop of the resistant heating element, the location can be confirmed advantageously. Namely, in this instance, the position of the terminal 71 can be regarded reasonably as the position of the outermost loop of the resistant heating element. Hence, when the position of the terminal 71 is compared with the position of the image of the resistant heating element which is displayed on the X-ray photograph, the position of the image of the outermost loop must appear slightly to the outside. Calculating the proportion of the position (distance from the center) of the terminal 71 to the position (distance from the center) of the image of the outermost loop of the resistant heating element, a copy of the X-ray photograph on a scale reduced based on the above proportion is produced. Thus, an original draft can be prepared. On the copy of the reduction, the position of the terminal 71 is in agreement with the position of the image of the outermost loop of the resistant heating element. Thus the whole image of the resistant heating element must agree with the real location of the embedded resistant heating element, in the plan view. From the above point of view, a photographing method as shown in FIG. 23a is more advantageous.

In the example shown in FIG. 23b, the surface provided with the above terminals and the like is set across the substrate from the X-ray film 76. Therefore, the terminal 71 at the position A which is D1-distant from the central terminal 85 is projected onto the position B which is D2-distant from the center, so that some errors are produced. Now, if it is assumed that the distance x between the X-ray film 76 and the X-ray source 77 is 1 m, the real distance D1 between the terminals is 75 mm and the thickness H of the heater is 15 mm, the relation:

$$\tan\alpha = D2/x = D1/(x-H),$$

is established. Substituting this formula with numeral values, D2 is found to be: D2=76.1 mm. Accordingly, it is concluded that an error of 1.1 mm from the real value has been produced.

In the case where a hole is bored in the vicinity of the peripheral terminal 71, if the convoluted resistant heating element has a distance between concentric loops thereof of 5 mm and the diameter of the bore is 3 mm, a positional deviation of the hole by a little over 1 mm could result in breakage of the resistant heating element 70. Accordingly, as compared with the example shown in FIG. 23a, error control is more difficult.

Therefore, in the case of FIG. 23b, it is necessary to calculate D1 from D2 according to the above formula and decide the real location of the terminal 71, in advance. If the real location of the terminal 71 is thus found, this is compared with the location of the outermost loop of the resistant heating element and the same as described above, the reduction ratio of the resistant heating element is calculated to produce a copy of the image of the resistant heating element on the reduced scale.

Thus, such a copy of the reduction of the resistant heating element may not be able to serve for determining positions in the ceramic substrate corresponding to the image of the reduction. However, if a marker 73 is photographed as shown in FIG. 23a in advance, since the position of the marker in the plan view never varies between the real object and the X-ray photograph, and the real object and X-ray photograph are registered by way of the marker, the reduced image of the resistant heating element can be brought into agreement exactly with the layout of the resistant heating element within the real object.

FIG. 24a is a cross-section schematically showing a mesh electrode 79, and FIG. 24b is a vertical cross-section schematically showing this electrode embedded within a ceramic substrate. This mesh electrode 79 can be used as, for example, electrodes for electrostatic chucks and high-frequency electrodes. In predetermined positions on the electrode 79, apertures 80 are formed, for example, four in number. As shown in FIG. 24b, the electrode 79 is embedded within a ceramic substrate 72, as described above, to form an integral body. Then, as described above, the ceramic substrate 72 is X-ray photographed, the location on the plan view of the apertures 80 opening on the electrode 79 is determined, and then conduits 81 can be bored through the apertures 80 in the ceramic substrate 72, without breaking the mesh electrode 79.

Figure 25A:
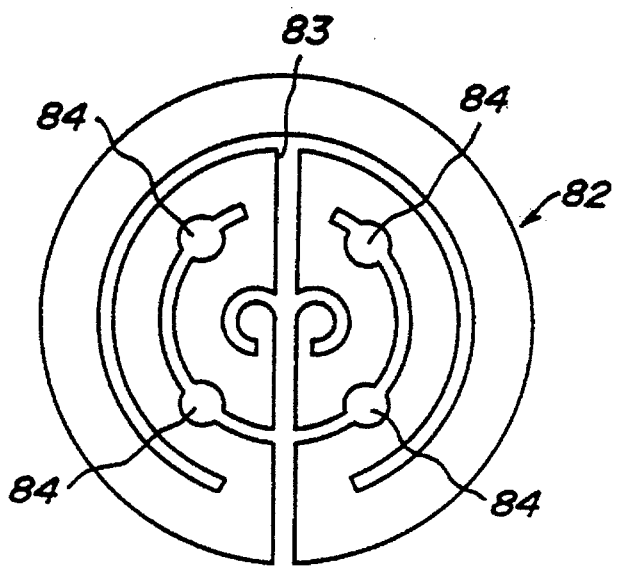
FIG. 25a is a plan view showing an electrode 82 having a special planar shape.

FIG. 25a is a plan view schematically showing an electrode 82 having a further different shape, particularly, a preferred shape for heater electrodes. This electrode 82 has an intricate shape, which is nearly circular in the periphery but has intricate cutouts 83 in the inside portion thereof. In predetermined positions on the electrode 82, apertures 84 are formed, for example, four in number.

Figure 25B:
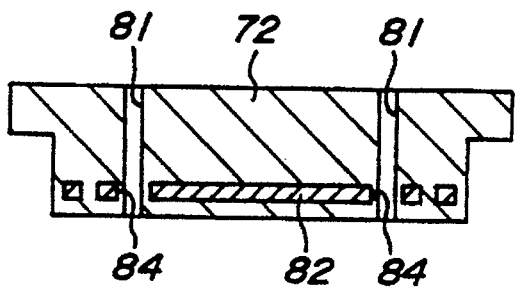
FIG. 25b is a vertical sectional view schematically showing a state of the electrode of FIG. 25a embedded within a ceramic substrate.

Then, as shown in FIG. 25b, the electrode 82 is embedded within a ceramic substrate 72, as described above, to form an integral body. Then, as described above, the ceramic substrate 72 is X-ray photographed, the location on the plan view of the apertures 84 opening on the electrode 82 is determined, and then conduits 81 can be bored through the apertures 84 in the ceramic substrate 72, without breaking the electrode 82.

Figure 25C:
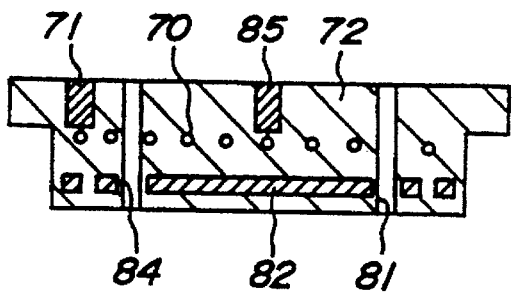
FIG. 25c is a vertical sectional view schematically showing a state of the electrode of FIG. 25a and a convoluted resistant heating element embedded within a ceramic substrate.

Alternatively, in FIG. 25c, the electrode 82 is embedded within a ceramic substrate 72, as described above, along with the resistant heating element 70 and the terminals 71, 85, to form an integral body. Then, as described above, the ceramic substrate 72 is X-ray photographed, the location on the plan view of the apertures 84 opening on the electrode 82 is determined, and then conduits 81 can be bored through the apertures 84 in the ceramic substrate 72, without breaking the electrode 82. Simultaneously therewith, the layout of the resistant heating element 70 is determined as described above, and then conduits 81 can be bored without breaking the resistant heating element 70.

Figure 26:
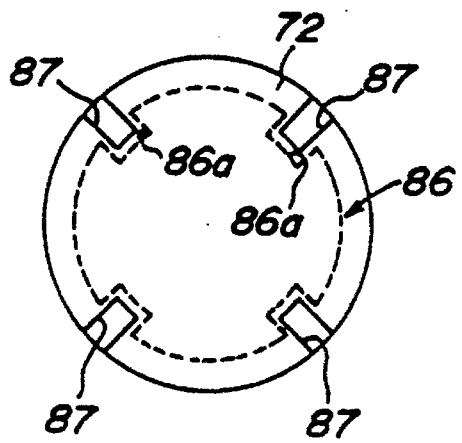
FIG. 26 is a plan view showing a state of pits 87 for receiving a lift pin provided on the surface side (a wafer-laying surface side) of the ceramic substrate 72.

Within the ceramic substrate 72 shown in FIG. 26, a nearly circular-shaped electrode 86 is embedded. On the electrode 86, for example, on four positions in the radial direction, cutouts 86a are formed. When this heater is manufactured, the electrode 86 is embedded within a ceramic substrate 72, as described above, to form an integral one body. Then, as described above, the ceramic substrate 72 is X-ray photographed, the location on the plan view of the cutouts 86a on the electrode 86 is determined, and then holes 87 for supporting a long lift pin can be bored in the ceramic substrate 72, without breaking the electrode 86.

Figure 27A:
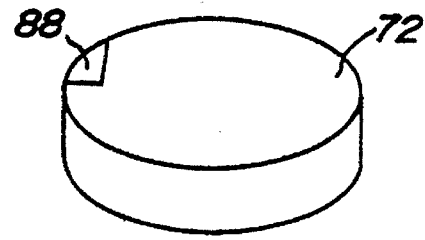
FIG. 27a is a perspective view showing a state of a marker 88 provided on a peripheral portion of the ceramic substrate 72.

Alternatively, in FIG. 27a, a metallic piece marker 88 is attached to the surface of the substrate 72.

Figure 27B:
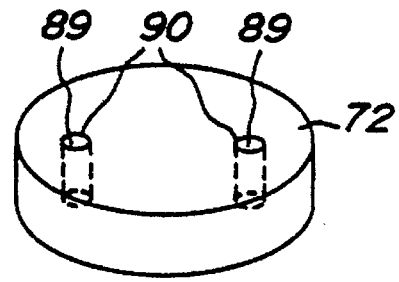
FIG. 27b is a perspective view showing a state of pin-shaped markers 89 provided on predetermined portions of the ceramic substrate 72.

In FIG. 27b, conduits 90 are bored vertically through the ceramic substrate 72, and then pin-shaped markers 89 are fitted in the conduits, respectively.

Figure 27C:
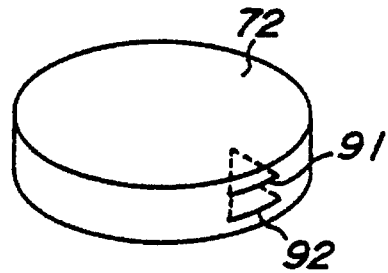
FIG. 27c is a slant view showing a state of markers 91, 92 provided on a side surface portion of the ceramic substrate 72.

In FIG. 27c, metallic piece markers 91, 92 are planted so as to be exposed on the side surface of the ceramic substrate 72.

Figure 28:
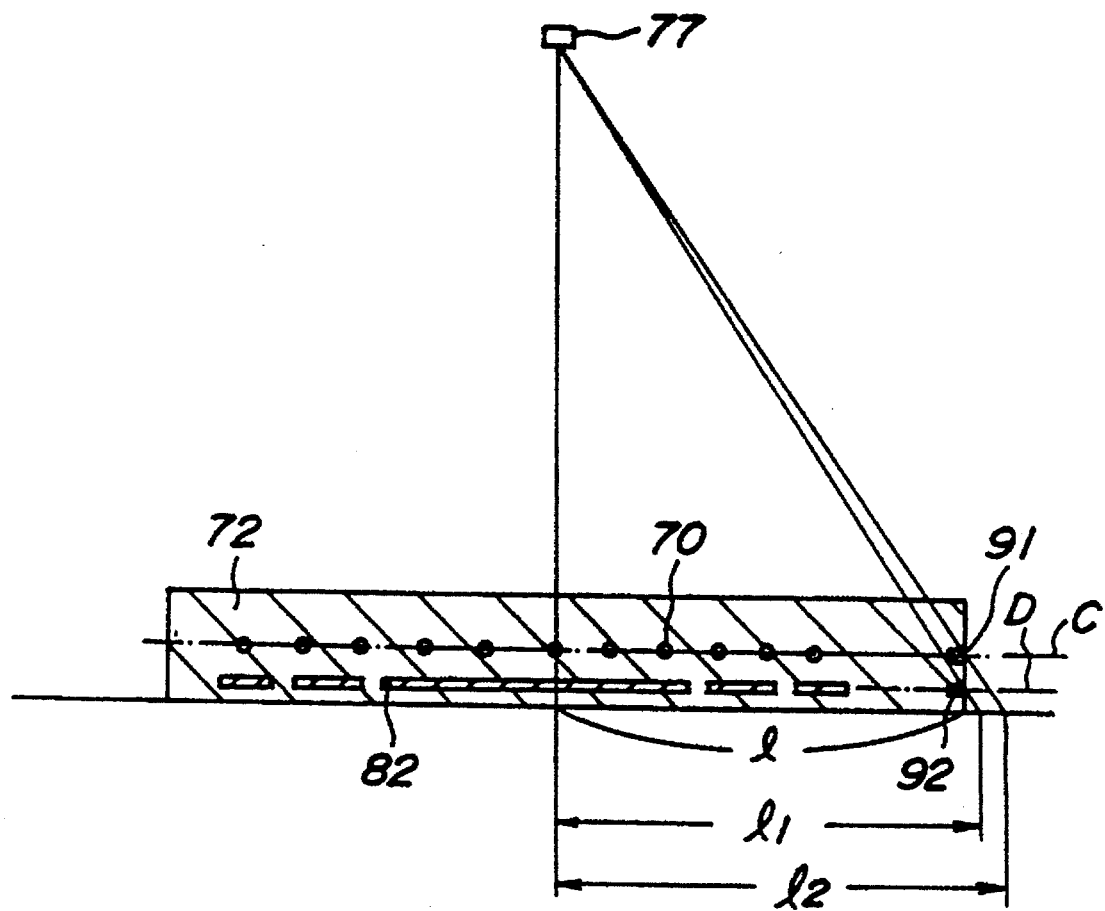
FIG. 28 is a schematic vertical sectional view illustrating a method for determining each position of an electrode and a convoluted resistant heating element, embedded within a ceramic substrate.

How markers 91, 92 are used will be explained hereinafter. On the side surface of the ceramic substrate, the markers 91, 92 are arranged on different levels from one another. For example, as shown in FIG. 28, it is assumed that a resistant heating element 70 and an electrode 82 are embedded within the ceramic substrate 72. The resistant heating element 70 is situated on the level shown by the chain line C and a marker 91 is arranged on the same level. Namely, the marker 91 is utilized as an indicator of the resistant heating element 70. Alternatively, the electrode 82 is situated on the level shown by the chain line D and another marker 92 is arranged on the same level. Namely, the marker 92 is utilized as an indicator of the electrode 82. The real horizontal distance between the center of the ceramic substrate and the marker 91 or 92 is 1. However, on the image projected onto the X-ray photograph, the distance between the marker 92 and the center of the substrate is $l_1$, that is larger than 1. Since the electrode 82 is positioned on the same level as the marker 92, the electrode 82 must have been displayed magnified by $l_1/1$ as compared with the real electrode 82. Therefore, in order to ascertain the real position of the electrode 82 from the image in an $l_1/1$ magnification, the image must be copied in reduction to compensate the above magnification.

Similarly, on the image projected onto the X-ray photograph, the distance between the marker 91 and the center of the substrate is $l_2$, that is larger than 1. Since the resistant heating element 70 is positioned on the same level as the marker 91, the resistant heating element 70 also must have been displayed magnified by $l_2/1$ as compared with the real resistant heating element. Therefore, in order to ascertain the real position of the resistant heating element 70 from the image in an $l_2/1$ magnification, the image must be copied in reduction to compensate the above magnification.

Alternatively, according to the fifth embodiment, an example wherein the spiral coil or convolution is flattened in the vertical direction of the ceramic substrate will be explained hereinafter.

Figure 29A:
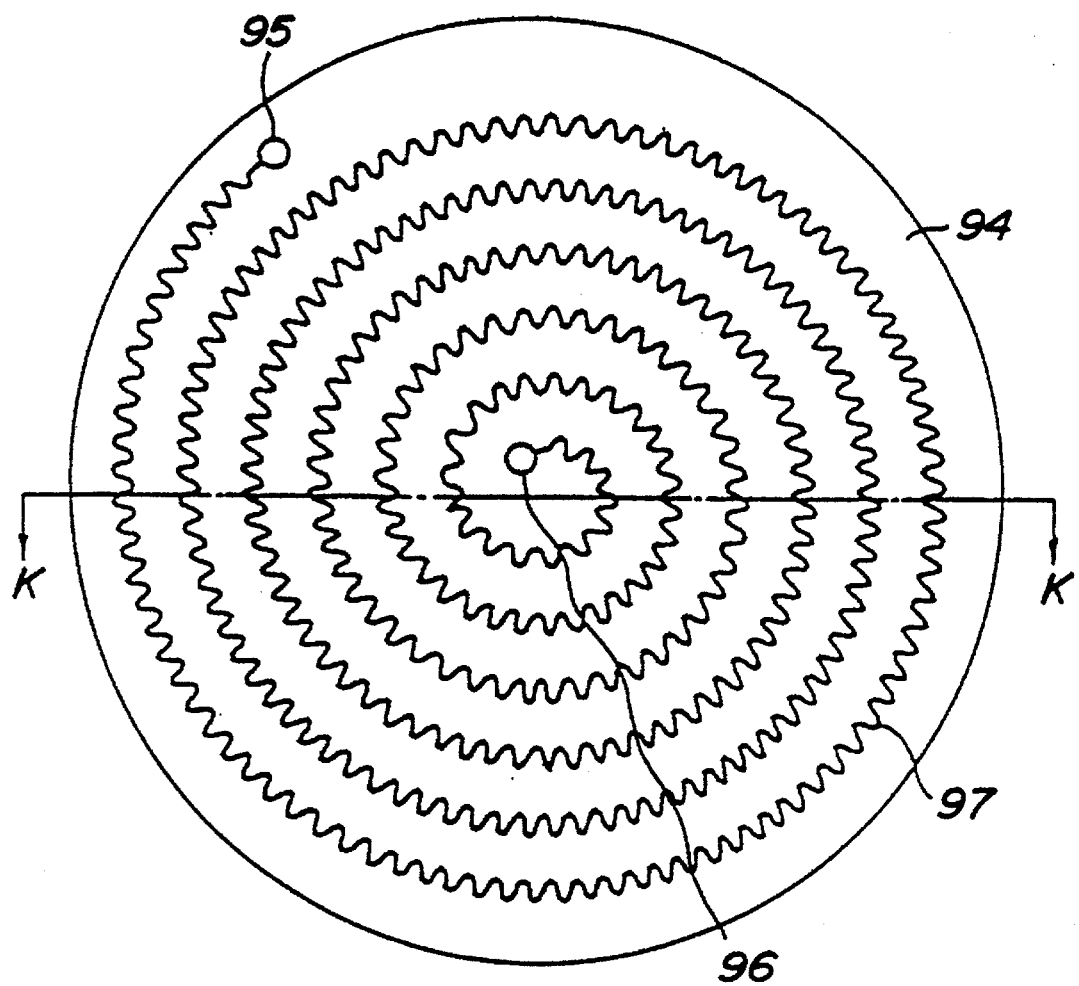
FIG. 29a is a perspective plan view showing a structure of an embodiment of the ceramic heater according to the present invention.
Figure 29B:
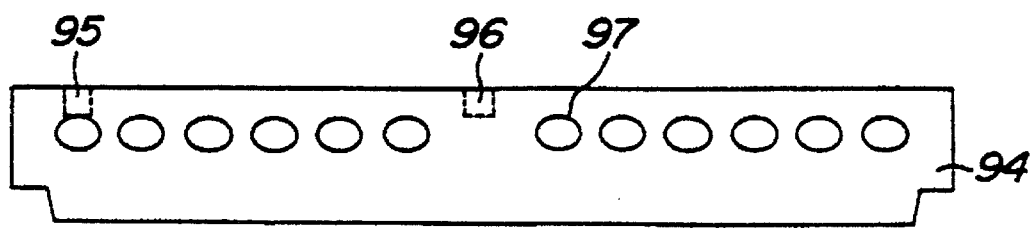

FIGS. 29a and 29b show an example of the ceramic heater according to the present invention. FIG. 29a is a plan view and FIG. 29b is a vertical sectional view along the K—K line of FIG. 29a. For convenience of explanation, in the plan view shown in FIG. 29a, a sight-through image of the resistant heating element, which is in fact invisible, is shown by solid line, and in the vertical sectional view shown in FIG. 29b, though transverse cross-sections of the filament of the resistant heating element would have been shown, the transverse-sectional shape of the coils of the resistant heating element is shown instead. In FIGS. 29a and 29b, a convoluted-coil resistant heating element 97 composed of a metallic material, such as tungsten, molybdenum or the like, is embedded within a disc-shaped, wafer heating ceramic substrate 94 comprising a dense, gastight inorganic material, such as silicon nitride or the like. Terminals 95, 96 for power supply are provided on the peripheral end portion and central portion, respectively, of the resistant heating element 97.

Figure 30A:
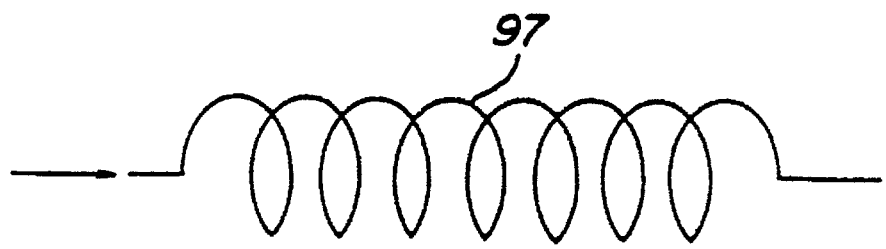
FIG. 30a is a perspective view illustrating a structure of a resistant heating element to be used in this invention.
Figure 30B:
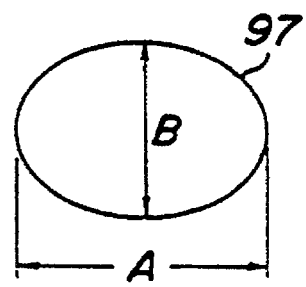

In the ceramic heaters according to the present invention, one of the important points is that the resistant heating element 97 is formed into a spiral coil having a flat transverse sectional shape with an aspect ratio of 1.5–3.0, and the major axis of the transverse section of the flattened coil is oriented in parallel with the radial direction of the resistant heating element 97. Namely, the resistant heating element 97 is used, of which spiral coil has a shape as shown in FIG. 30a and a flat transverse section as shown in FIG. 30b when it is viewed from the arrow-indicated direction shown in FIG. 30a. When the ratio A/B of the major axis A to the minor axis B shown in FIG. 30b is defined as the aspect ratio, the resistant heating element 97 having an aspect ratio of 1.5–3.0 is embedded within the ceramic substrate 94, in a fashion such that the flat side along the major axis of the coil is oriented in the radial direction of the ceramic substrate 94. Thus, the ceramic heater according to the present invention is obtained.

A heater comprising a ceramic substrate and a resistant heating element with such a spiral coil shape embedded therein can be produced by embedding a resistant heating element which has been formed to have an aspect ratio as described above is embedded within a ceramic shaped body and then firing the shaped body by means of hot-pressing, or the like. Alternatively, the coil may be deformed by pressurizing it with pressures and temperatures increased during firing by hot-pressing.

Practical working example will be explained hereinafter.

EXAMPLE 1

Figure 31:
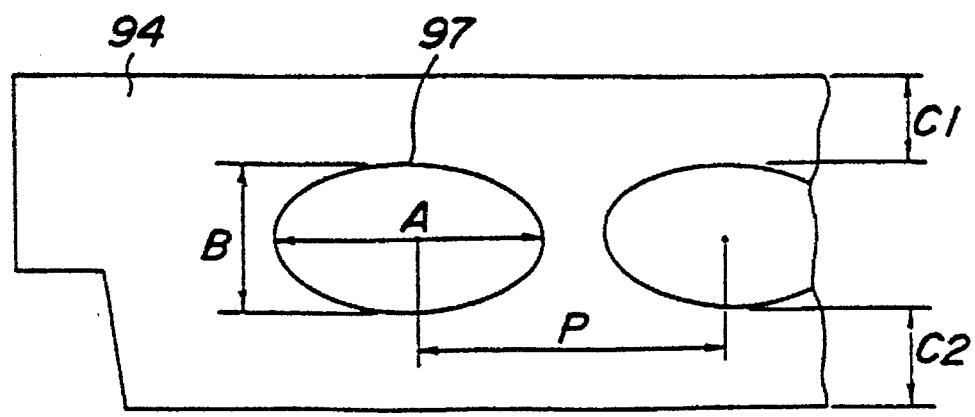
FIG. 31 is a schematic view illustrating the relative position of the resistant heating element in a working example of the present invention.

Convoluted-coil resistant heating elements composed of tungsten, as shown in FIGS. 30a, 30b, having different aspect ratios ranging between 1 and 8 from each others as shown in Table 4 below, were embedded within ceramic substrates, respectively, as shown in FIGS. 29a, 29b and 31, in a fashion such that the flat side of the coil is oriented in the radial direction of the substrate. Thus, ceramic heaters, Sample Nos. 1–6, were manufactured. In the manufacture, as shown in FIG. 31, the convolution of each ceramic heater which had a distance P of 15 mm between the centers of adjacent loops of the convolution was positioned on a level such that the summit of the shape of the coil and the top surface of the substrate 94 were spaced C1 apart, the bottom of the coil and the bottom surface of the substrate 94 were spaced C2 apart, and C1=C2=5 mm. A distance as much as 5 mm of C1 and C2 may result in that the shape of the spiral coil of the resistant heating element will not negatively affect a uniform temperature distribution over the surface of the ceramic substrate.

In the course of manufacture, the tungsten spiral coil was embedded in the form of a concentric convolution within a silicon nitride powder added with predetermined sintering aids which was shaped by means of a mold press. This shaped body was sintered by hot-pressing at a pressure of 200 kg/cm² and a temperature of 1,800° C. for 2 hours, under a nitrogen atmosphere of 1.5 atm. The obtained aspect ratio was 3. The factors for deciding the aspect ratio are mainly firing temperatures, pressures and dimensions of the coils. Changing these factors, resistant heating elements as shown in Table 4 were fabricated. During shaping, the coils deform more or less, however, far less than deformations during firing.

In order to appraise the characteristics of the obtained ceramic heaters, the resulting ceramic heaters were heated at 400° C. in a vacuum chamber of $10^{-5}$ torr., and the temperature distribution over the surface and the maximal and minimal temperatures were found. Then, simulating a membrane deposition process, $N_2$ gas was introduced at a stabilized condition at 400° C. until 0.1 torr. was reached, and the time required for restabilization at 400° C. was measured. The results are shown in Table 4.

TABLE 4

| Sample | A:B (mm) | Aspect ratio | Breadth of temperature distribution (°C.) | Time for restabilization * |
| --- | --- | --- | --- | --- |
| 1 | 6:6 | 1 | 15 | 3 |
| 2 | 6:4 | 1.5 | 10 | 1 |
| 3 | 6:3 | 2 | 10 | 1 |
| 4 | 6:2 | 3 | 9 | 1 |
| 5 | 6:15 | 4 | 7 | 1 |
| 6 | 6:1 | 6 | 8 | 1 |

*) Ratio to the time required for restabilizing Sample No. 6

It can be understood from the results shown in Table 4 that Sample Nos. 2–6 which have an aspect ratio of not less than 1.5 have a narrow breadth of temperature distribution, a high performance of uniform heating, a short time for restabilization and an excellent response performance as compared with Sample No. 1 which has an aspect ratio of 1. Accordingly it is found that an aspect ratio of at least 1.5 is necessary.

EXAMPLE 2

As a heat cycle test of the ceramic heaters, Sample Nos. 1–6, in Example 1, repetitive heat cycles were executed with a single cycle consisting of: a temperature increasing rate of 600° C./h, a 1 hour maintaining period at 600° C., and a temperature decreasing rate of 600° C./h. Then, the proportion of resistance change was found. The results are shown in FIG. 32.

Figure 32:
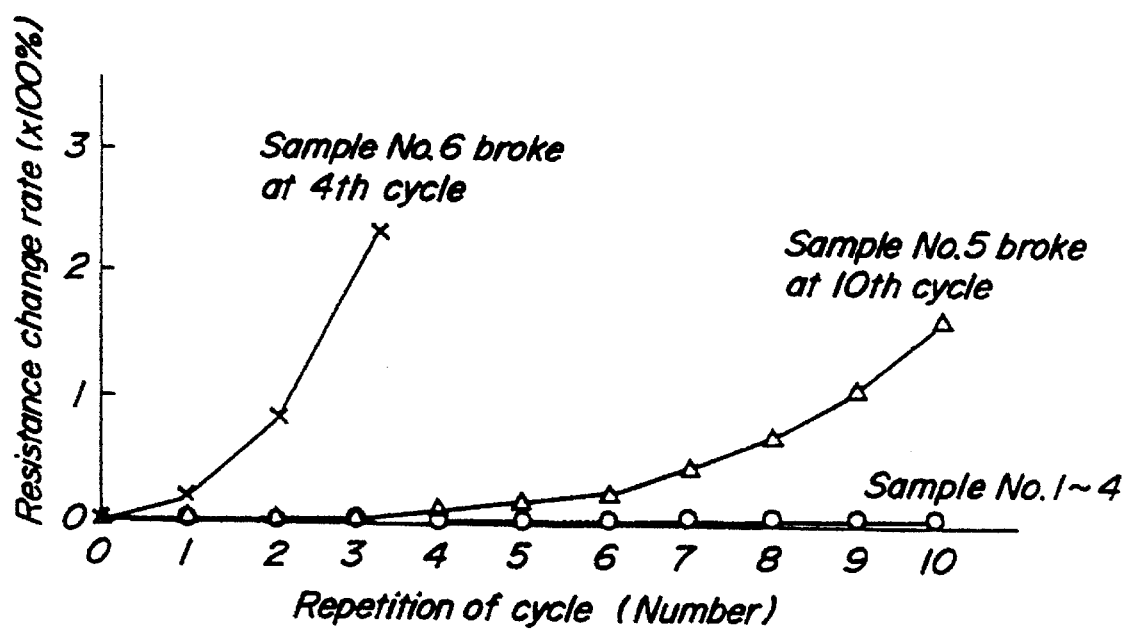
FIG. 32 is a graph showing the result of a heat-cycle test in a working example of the present invention.

It can be understood from the results shown in FIG. 32 that Sample Nos. 1–4 which have an aspect ratio of 1–3 exhibit excellent characteristics with no resistance increase or filament breakage, as compared with Sample Nos. 5 and 6, having an aspect ratio of 4 and 6, respectively. This is considered to be attributable to formation of cracks at bent portions of an increased curvature in the filament of the resistant heating element, caused by stresses built up due to expansion and contraction during the heat cycle as well as difference in thermal expansion between the ceramic substrate and resistant heating element, which cracks result in increase of the resistance value with an eventual breakage of the filaments.

It is understood from the above results of Examples 1 and 2 that the flat transverse-sectional shape of the resistant heating element is required to have an aspect ratio between 1.5 and 3.0. Furthermore, though, in the above working examples, tungsten was used for the resistant heating element and silicon nitride was used for the ceramic substrate, it is to use other materials, such as molybdenum or the like, for the resistant heating element, and such as aluminum nitride or the like, for the ceramic substrate, to obtain the same effects.

We claim:

1. A process for manufacturing ceramic heaters, comprising the steps of:

holding a convolution of a spiral-coiled high melting point metallic filament in a predetermined planar pattern;

then, heat-treating said convolution at a temperature not higher than a primary recrystallization commencement temperature of said high melting metal under a non-oxidative atmosphere to provide a resistant heating element;

embedding the resulting resistant heating element within a ceramic shaped body; and then, sintering said ceramic shaped body to provide a ceramic heater comprising a ceramic substrate and said resistant heating element embedded within said ceramic substrate along said predetermined planar pattern.

2. The process according to claim 1, wherein the heat treatment is conducted a temperature not lower than 800° C.

3. The process according to claim 1, wherein said high melting point metal is composed of tungsten and the heat treatment is conducted at a temperature between 800° C. and 900° C.

4. The process according to claim 1, wherein the heat treatment is conducted under a non-oxidative atmosphere.

5. A mold for heat-treating a convolution of a spiral-coiled, high melting point metallic filament, comprising a groove for holding said convolution in a predetermined planar pattern, and composed of a material stable at a heat treatment temperature of said high melting point metal.

6. The mold according to claim 5, further comprising fixing members for securing said convolution to the mold at predetermined positions to hold said convolution in said planar pattern.

7. A ceramic heater, comprising: a ceramic substrate and a resistant heating element embedded within said substrate along a predetermined planar pattern, wherein said resistant heating element is obtained by heat-treating a convolution of a high melting point metallic, spiral-coiled filament at a temperature not higher than a primary recrystallization commencement temperature of said high melting point metal under a non-oxidative atmosphere, while said convolution is held in and along the predetermined pattern.

8. A ceramic heater, comprising: a ceramic substrate and a resistant heating element embedded within said ceramic substrate, said resistant heating element being a convolution of a spiral coil, the number of coils per a unit length of said convolution being set at a predetermined value in each of defined domains of the ceramic heater, and when the number of coils per a unit length of said convolution is determined, the relation of a maximal value, a minimal value and a mean value, of all the determined numbers of coils in the above domains, satisfies the following formula:

(maximal value−minimal value)/mean value≦0.1.

9. A process for manufacturing ceramic heaters, comprising the steps of:

holding an untreated convolution in a predetermined planar pattern in a fashion such that, when the number of coils per a unit length of said untreated convolution is determined, the relation of a maximal value, a minimal value and a mean value, of all the determined numbers of coils in defined domains, satisfies the formula:

(maximal value−minimal value)/mean value≦0.05;

then heat-treating said untreated convolution, under a non-oxidative atmosphere to provide a shape-stabilized convolution;

then embedding the resulting shape-stabilized convolution within a ceramic shaped body; and then sintering the above ceramic shaped body to provide a ceramic heater as claimed in claim 8.

10. The process according to claim 9, wherein said untreated convolution is held in a predetermined planar pattern, by securing said untreated convolution at predetermined portions thereof on a mold.

11. An apparatus for heating semiconductor wafers, comprising: a disc-shaped ceramic substrate; and a resistant heating element embedded within said ceramic substrate, wherein said resistant heating element has a planar shape comprising a plurality of concentric loops differing in diameter from each other and connecting portions which connect inner loops in sequence with outer loops to form a series of resistant heating elements.

12. The apparatus according to claim 11, wherein said resistant heating element is divided into a peripheral portion and an inside portion of said substrate and a heat radiation value of each of the resistant heating elements in the peripheral portion and inside potion is controllable, independently.

13. The apparatus according to claim 11, wherein said substrate is provided on a peripheral side surface thereof with terminals for supplying power to said resistant heating element.

14. The apparatus according to claim 11, wherein the loops are partly bent inwardly with a large curvature.

15. A process for manufacturing ceramic articles comprising a ceramic substrate, an electroconducting body embedded within said ceramic substrate and a conduit or pit bored avoiding said electroconducting body in said ceramic substrate, comprising the steps of: taking an X-ray transmission photograph of said ceramic substrate and then forming said conduit or pit, based on the X-ray transmission photograph.

16. The process according to claim 15, wherein said electroconducting body is a resistant heating element and said ceramic articles further comprise terminals for supplying power to said resistant heating element, embedded within said ceramic substrate.

17. The process according to claim 16, wherein a surface provided with said terminals is positioned to face an X-ray film when the X-ray transmission photograph is taken.

18. The process according to claim 15, wherein a metal piece is attached onto said ceramic substrate and a boring position of at least one of the pit and conduit is determined by taking the X-ray transmission photograph and compensating a deviation from an object shown in said X-ray transmission photograph by utilizing said metal piece as a marker.

19. A ceramic heater, comprising: a board-shaped ceramic substrate for heating wafers and a resistant heating element embedded within said ceramic substrate, said resistant heating element being a convoluted spiral coil embedded in a fashion such that the spiral coil is flattened in the vertical direction of said ceramic substrate and that a ratio of a dimension in the horizontal direction to the dimension in the vertical direction of said spiral coil, is in the range between 1.5 and 3.0.

20. The ceramic heater according to claim 19, wherein said ceramic substrate is disc-shaped.

\* \* \* \* \*